(12) United States Patent
Kawasumi et al.

(10) Patent No.: US 7,797,819 B2
(45) Date of Patent: Sep. 21, 2010

(54) COMPONENT MOUNTING APPARATUS

(75) Inventors: Kensuke Kawasumi, Osaka (JP); Hiroto Miyazaki, Osaka (JP); Nobuhiro Nakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 209 days.

(21) Appl. No.: 12/073,520

(22) Filed: Mar. 6, 2008

(65) Prior Publication Data
US 2008/0163480 A1    Jul. 10, 2008

Related U.S. Application Data

(62) Division of application No. 10/574,914, filed as application No. PCT/JP2004/014723 on Oct. 6, 2004, now Pat. No. 7,353,589.

(30) Foreign Application Priority Data

Oct. 15, 2003  (JP)  ............... 2003-354896
Oct. 16, 2003  (JP)  ............... 2003-356060

(51) Int. Cl.
    *B23P 19/02*    (2006.01)
(52) U.S. Cl. ............... 29/740; 29/742; 29/743; 29/720; 29/834
(58) Field of Classification Search ........... 29/740–743, 29/834; 414/737, 752; 901/45–47; 294/64.2
See application file for complete search history.

(56) References Cited

U.S. PATENT DOCUMENTS

| 5,208,969 | A | 5/1993 | Hidese |
|---|---|---|---|
| 5,329,692 | A | 7/1994 | Kashiwagi |
| 5,860,208 | A | 1/1999 | Nomura |
| 5,862,586 | A | 1/1999 | Kimura |
| 6,298,547 | B1 | 10/2001 | Okuda |
| 6,519,838 | B1 | 2/2003 | Okuda |
| 6,739,043 | B2 | 5/2004 | Shirakawa |
| 6,792,676 | B2 | 9/2004 | Haji et al. |
| 7,089,656 | B2 | 8/2006 | Nagao et al. |
| 7,353,589 | B2 * | 4/2008 | Kawasumi et al. ............ 29/740 |
| 2003/0135991 | A1 | 7/2003 | Nagao et al. |

FOREIGN PATENT DOCUMENTS

| JP | 7-15183 | 1/1995 |
|---|---|---|
| JP | 9-92666 | 4/1997 |
| JP | 11-312885 | 11/1999 |
| JP | 2000-294988 | 10/2000 |
| JP | 2000-294991 | 10/2000 |

(Continued)

*Primary Examiner*—Minh Trinh
(74) *Attorney, Agent, or Firm*—Wenderoth, Lind & Ponack, L.L.P.

(57) ABSTRACT

A component mounting apparatus includes one head unit which has a component holding member capable of holding a component and which is selected from among a plurality of types of head units according to a type of the fed component, a head moving unit which has a head fitting portion onto which the selected one head unit is removably loaded and which moves the head unit loaded on the head fitting portion in a direction extending generally along a surface of the board, and a head control unit which is provided for each of the head units and which performs control for component mounting operation by a head unit corresponding to the loaded head unit.

1 Claim, 16 Drawing Sheets

FOREIGN PATENT DOCUMENTS

| | | |
|---|---|---|
| JP | 2001-135996 | 5/2001 |
| JP | 2003-218589 | 7/2003 |
| JP | 2004-6510 | 1/2004 |
| JP | 2004-6512 | 1/2004 |
| JP | 2004-241595 | 8/2004 |
| JP | 2004-265946 | 9/2004 |

* cited by examiner

COMPONENT MOUNTING APPARATUS

This is a divisional application of Ser. No. 10/574,914, filed Apr. 7, 2006, which is the National Stage of International Application No. PCT/JP2004/014723, filed Oct. 6, 2004 and now U.S. Pat. No. 7,353,589.

TECHNICAL FIELD

The present invention relates to a component mounting apparatus for mounting fed components onto a board and, more specifically, to such a component mounting apparatus ready for mounting of diversified types of components.

BACKGROUND ART

As this type of component mounting apparatus, there have conventionally been known those of various types of structures. As an example of such component mounting apparatuses, a schematic appearance perspective view of a conventional component mounting apparatus 500 is shown in FIG. 13 (see, e.g., Japanese unexamined Patent Publication No. 2001-135996).

As shown in FIG. 13, the component mounting apparatus 500 includes a head unit 510 which has a suction nozzle for sucking and holding a component, and an XY robot 520 which has the head unit 510 equipped thereon and which moves the head unit 510 in an X-axis direction or a Y-axis direction, as viewed in the figure. In the component mounting apparatus 500, as the XY robot 520 is driven, the suction nozzle of the head unit 510 sucks and holds a component fed from a component feed unit 530 or 540, and is moved by the XY robot 520 to above a board 560 held on a board conveyance unit 550, thus being enabled to perform mounting operation of the sucked-and-held component onto the board 560. The component mounting apparatus 500 also includes a control unit 570 for performing operation control for the individual constitutive units integrally in association with one another to thereby exert control of the mounting operation for the component.

Now in the component mounting apparatus 500 having such a structure as described above, a schematic control block diagram showing the control-related structure including the control unit 570 is shown in FIG. 14, and the control-related structure is explained with reference to FIG. 14.

As shown in control block diagram of FIG. 14, the control unit 570 includes a power supply unit 571 which feeds driving power for a head mechanism section 511 that is a section for performing mechanical operation of the head unit 510 (e.g., a motor for a rotating drive unit or an up/down unit for the suction nozzle, etc.), a driver circuit 572 for driving the head mechanism section 511, and a main unit controller 573 for exerting the control over the driver circuit 572 and the head mechanism section 511. Also, between the control unit 570 and the head mechanism section 511 of the head unit 510 are provided a multiplicity of interconnection lines. In more detail, there are provided power line(s) L10 for interconnecting the head mechanism section 511 and the power supply unit 571 to feed driving power from the power supply unit 571 to the head mechanism section 511, I/O line(s) L11 for interconnecting the head mechanism section 511 and the main unit controller 573 to perform transmission of control information therebetween, and motor line(s) L12 for interconnecting the head mechanism section 511 and the driver circuit 572 to perform transmission of signals associated with the drive of the head mechanism section 511. Further, within the control unit 570, the main unit controller 573 and the driver circuit 572 are connected to each other by control line(s) L13 so as to be enabled to transmit control information to each other.

DISCLOSURE OF INVENTION

In recent years, along with diversification of electronic equipment in the market, as the type of component-mounted boards to be contained in the electronic equipment has been also diversified, so the type of components to be mounted (placed) onto the board is also diversified more and more. For instance, there are cases where small general-purpose components such as chip components are used, or where high-precision IC components or the like are used, or where both are compositely mounted. In the case of mounting of chip components onto a board, it is sought how the component can be mounted at high speed and with high efficiency. Meanwhile, in the case of mounting of IC components onto a board, it is sought to enhance the mounting accuracy therefor. Like this, what is sought varies depending on the type of the component handled. Accordingly, it is strongly desired for the component mounting apparatus to flexibly meet such diversification of components and be able to fulfill efficient component mounting.

As one method for flexibly meeting such diversification of components, for example, in the component mounting apparatus 500, the head unit 510 to be mounted on the XY robot 520 is removably provided and equipped with a plurality of types of head units capable of mounting of various types of components interchangeably, where one of the head units corresponding to the type of a component to be mounted is selected and set to load the XY robot 520 therewith, thus providing for mounting of diversified components onto a board. In such a method, even with a change of the type of components to be mounted, selective loading of a head unit corresponding to the change allows the mounting of diversified components to be carried out.

However, with such a method, although the change of the head unit to be set onto the XY robot 520 can be made mechanically in the component mounting apparatus 500, yet the change of the head unit would give rise to a need for changing the control unit 570 with another fitted to the control of the head unit. This changing work would take large time and labor, posing a problem that the changing works could no longer be easily done.

More specifically, as shown in FIG. 14, upon a change of the head unit 510, the main unit controller 573 or the driver circuit 572 needs to be changed to another fitted to the specifications of the substitutive head unit 510 (i.e., one fitted to operation control) or to be subjected to adjustment or the like.

Further, as shown in FIG. 14, when the head unit 510 is changed over, there arises a need for the work of canceling the connection between the head mechanism section 511 of the head unit 510 and the control unit 570 by a plurality of interconnecting lines and thereafter making another connection with the newly provided head unit 510. In this case, a large number of these interconnecting lines take a large amount of labor for the work. For example, since the interconnecting lines provided include power lines L10×2 lines, I/O lines L11×2 to 3 lines (corresponding to the number of suction nozzles provided) and motor lines×10 lines, a high amount of work would result. Moreover, depending on the type of the head unit provided for a change, a change of the interconnecting lines themselves might be involved in some cases. In such a case, the resulting changing work would be far from easy work, making it impossible to achieve the mounting of diversified components flexibly and efficiently.

This leads to a problem that any productivity improvement for component mounting would be unachievable.

Accordingly, an object of the present invention, lying in solving the above-described problems, is to provide a component mounting apparatus which is capable of achieving mounting of diversified components flexibly and efficiently and achieving productivity improvement in the component mounting that a fed component is mounted onto a board.

In order to achieve the above object, the present invention has the following constitutions.

According to a first aspect of the present invention, there is provided a component mounting apparatus for mounting fed components onto a board, comprising:

one head unit which has a component holding member for holding one of the components and which is selected from among a plurality of types of head units according to types of the fed components;

a head moving unit which has a head fitting portion onto which the selected one head unit is removably loaded, for moving the head unit loaded on the head fitting portion in a direction extending generally along a surface of the board; and a head control unit which is provided for each of the head units, for controlling component mounting operation by a head unit corresponding to the loaded head unit.

According to a second aspect of the present invention, there is provided the component mounting apparatus as defined in the first aspect, wherein the head control unit includes a plurality of control circuit boards having control circuits for performing control for the component mounting operation by the head unit, and the control circuit boards are disposed so that their surfaces become generally perpendicular to a surface of the board.

According to a third aspect of the present invention, there is provided the component mounting apparatus as defined in the first or second aspect, wherein the control for the component mounting operation by the head unit includes control for holding or holding-release operation for the component by the component holding member as well as control for moving-up and -down operation of the component holding member.

According to a fourth aspect of the present invention, there is provided the component mounting apparatus as defined in the second aspect, wherein ventilation-use voids for removal of heat generated from the control circuit boards during the control for the component mounting operation are provided between the control circuit boards.

According to a fifth aspect of the present invention, there is provided the component mounting apparatus as defined in the second aspect, wherein each of the control circuit boards includes a driver circuit for driving the component holding member in the head unit, and a controller for controlling the driver circuit.

According to a sixth aspect of the present invention, there is provided the component mounting apparatus as defined in the second aspect, further comprising a moving-unit control unit for performing control for moving operation of the head unit by the head moving unit, and a main control unit for performing control for the moving operation of the head unit by the moving-unit control unit and control for the mounting operation of the head unit by the head control unit in association with each other, wherein the main control unit is provided on an apparatus main body side.

According to a seventh aspect of the present invention, there is provided the component mounting apparatus as defined in the sixth aspect, further comprising communication means for performing communications of information for the control processes between the head control unit and the main control unit of the selected one head unit, wherein the communication means is used in common to the head units of the individual types.

According to an eighth aspect of the present invention, there is provided the component mounting apparatus as defined in the first or second aspect, wherein a head unit which is different in type from the selected one head unit and which is among the remaining plurality of types of head units except the selected one head unit is provided on standby so as to be fittable to the head unit fitting portion, and the head moving unit is loaded with the selected one head unit changeably with the standing-by different type of head unit.

According to a ninth aspect of the present invention, there is provided the component mounting apparatus as defined in the first or second aspect, wherein the plurality of types of head units include a chip component mounting head unit or a semiconductor component mounting head unit.

According to a tenth aspect of the present invention, there is provided the component mounting apparatus as claimed in the first aspect, wherein the plurality of types of head units include a component mounting head for mounting the components onto the board,
the component mounting head comprising:
the component holding member for releasably holding one of the components;
an up/down drive unit for moving up and down the component holding member; and
a support member which is a member for up/down movably supporting the component holding member and supporting the up/down drive unit and which is releasably fixed to the head fitting portion of the head moving unit, and wherein support centers, one of which is a support center for supporting the up/down drive unit by the support member and other of which is a support center for supporting the component holding member by the support member, are positioned so that a distance in the direction extending generally along the surface of the board between a fixation center of the support member for fixing the head moving unit to the head fitting portion and the support center for the up/down drive unit becomes smaller than a distance in said direction between the support center for the component holding member and the fixation center, and moreover at least part of the support member is positioned between the support center for the up/down drive unit and the support center for the component holding member, where the up/down drive unit and the component holding member are supported by said at least part of the support member.

According to an eleventh aspect of the present invention, there is provided the component mounting apparatus as defined in the first aspect, wherein the plurality of types of head units include a component mounting head for mounting one of the components onto the board,
the component mounting head comprising:
the component holding member for releasably holding one of the components;
an up/down drive unit for moving up and down the component holding member; and
a support member which is a member for up/down movably supporting the component holding member and supporting the up/down drive unit and which is releasably fixed to the head fitting portion of the head moving unit, and wherein part of the support member is positioned between a support center of the up/down drive unit by the support member and a support center of the component holding member, where the up/down drive unit and the component holding member are supported by said at least part of the support member.

According to the first aspect or the second aspect of the present invention, one head unit selected from among a plurality of types of head units according to a type of the fed component is removably fittable to the head fitting portion of the head moving unit, and a head control unit which performs control for mounting operation of the component by the one head unit is provided and supported by the one head unit itself and not provided on the apparatus main body side of the component mounting apparatus. Thus, even if the one head unit is changed to a head unit of a different type among the plurality of types of head units, the head control unit can also be changed simultaneously with the changing of the head unit.

In conventional component mounting apparatuses, since the head control unit is provided integrally with the control unit on the apparatus main body side, such changing of the head unit, when performed, involves changing the head control unit in the control unit to another head control unit of specifications suited to the substitutive head unit together with the changing of the head unit, causing large time and labor to be taken for the changing work of the head unit. According to the first aspect, however, changing the head unit allows the head control unit to be changed automatically. Therefore, the changing work for the head unit can be facilitated, making it possible to flexibly and efficiently meet the mounting of diversified components. As a result, it is possible to provide a component mounting apparatus which makes it practicable to improve the productivity for component mounting.

Also, by the arrangement that respective surfaces of a plurality of control circuit boards provided in the head control unit are arranged so as to be parallel to one another, not only the changing work of the head unit allows the changing work of the head control unit to be achieved simultaneously therewith, but also heat (calories) generated from the individual control circuit boards during the control operation can be let to effectively escape by utilizing spaces of gaps between the individual adjacently-positioned boards. In particular, by the arrangement that the individual control circuit boards are arranged so as to be generally perpendicular to the surface of the board onto which the component is to be mounted, the generated heat can be let to effectively escape in the vertical direction, which is a direction extending along the surfaces of the individual control circuit boards (i.e., the heat can be efficiently removed by natural ventilation using the ascending air caused by the heat), so that the individual control circuit boards can properly be cooled. Also, since the individual control circuit boards are moved along with the move of the head unit itself by the head moving unit, there is a further advantage that the move allows the individual control circuit boards to be positively cooled. Since such calories generated along with control operation can be let to efficiently escape, the control operation for component mounting can be stabilized and, as a result, the productivity for component mounting can be improved.

Further, according to the other aspects of the present invention, since voids for use of ventilation for removal of the generated heat by natural ventilation are positively provided between the individual control circuit boards, the removal of heat by natural ventilation can be fulfilled more effectively.

By virtue of the arrangement that the individual control circuit boards each include a driver for performing drive over the component holding member and a controller for controlling the driver, the changing works for the driver and the controller, which are the individual control circuit boards, can be achieved simultaneously when the changing work of the head unit is performed, thus facilitating the changing works actually. Also, since the driver and the controller are included in the head control unit, interconnection lines between the driver and the controller can be contained inside the head unit, thus making it possible to reduce the number of interconnection lines between the head control unit and the apparatus main body side. Accordingly, connection and disconnection works for the interconnection lines necessitated due to the changing of the head unit can be simplified. Further, such reduction of the number of interconnection lines between the head control unit and the apparatus main body side allows operating characteristics in the moving operation of the head unit by the head moving unit to become successful, producing an effect that efficient component mounting can be achieved.

A moving-unit control unit for performing control for moving operation by the head moving unit, and a main control unit for controlling the control by the moving-unit control unit and control by the head control unit integrally in association with each other are provided on the apparatus main body side. In this arrangement, a control-related structure that needs changing along with the changing of the head unit, out of the control-related structures in the component mounting apparatus, i.e., the head control unit only is provided in the head unit, by which the structure of the head unit like this can be simplified and downsized, thus contributing to efficient component mounting.

Further, by virtue of the arrangement that communication means for performing communications of information for the control processes between the head control unit and the main control unit in the selected one head unit is provided on the apparatus main body side and used in common to the head units of the individual types, the changing work of the head unit does not involve the changing of the communication means, and the changing work can be made easier.

With respect to the positional relation among the individual support centers of the component holding member and the up/down drive unit in a direction extending generally along the surface of the board in the component mounting head, individual support centers are so positioned that a distance between a fixation center of the support member for fixation to the head moving unit and a support center of the up/down drive unit becomes smaller than a distance between the fixation center of the support member and a support center of the component holding member. Thus, in the component mounting head, the up/down drive unit having a characteristic that occurrence of a large thrust is involved in its driving can be positioned closer to the fixation center of the support member, so that the moment generated due to the occurrence of the thrust can be reduced. As a result of this, operating characteristics in the moving operation of the component mounting head by the head moving unit can be improved, so that a component mounting head capable of fulfilling efficient and high-precision moving operation can be provided, and the productivity for component mounting can be improved.

By virtue of the arrangement that at least part of the support member is positioned between the support center of the up/down drive unit and the support center of the component holding member, where the up/down drive unit and the component holding member are supported by the at least part of the support member, it becomes possible to fulfill a positioning in which the support center of the up/down drive unit and the support center of the component holding member are set close to part of the support member without being affected by their mutual positioning, even in such a case as described above, i.e., in the case where the distance between the fixation center of the support member and the support center of the up/down drive unit is smaller than the distance between the fixation center of the support member and the support center of the component holding member. As a result of this, the up/down drive unit and the component holding member can be supported by the support member securely with a smaller member, thus allowing the component mounting head to be reduced in size and weight and contributing to improvement of the productivity for component mounting.

With a view to fulfilling such positional relation among the individual support centers, the up/down drive unit formed of a ball screw shaft or the like is positioned inside the support member, and the component holding member is exposed and positioned on the exterior side face of the support member. As a result of this, workability for the component holding member that needs high frequencies of maintenance in the component mounting head, such as changing and adjustment and the like of the component holding member can be made successful, allowing the maintainability of the component mounting head to be enhanced. Thus, component mounting of improved productivity becomes achievable.

On the other hand, the up/down drive unit housed and positioned within the support member based on the positioning of the component holding member on the exterior side face of the support member generally requires only such maintenance as injection of grease. Therefore, only ensuring the access route for the grease injection work can prevent deterioration of the maintainability even with such positioning as described above.

With respect to the effects obtained from the individual aspects, by the arrangement that the component mounting head includes a plurality of the component holding members and a plurality of the up/down drive units arrayed in parallel to one another and in line, the moment generated by the drive by the individual up/down drive units can be reduced more effectively, and the maintainability of the component mounting head can be improved while the operating characteristics of the component mounting head can be improved, so that the productivity in the component mounting head can be enhanced.

Further, in the component mounting head, a component recognition unit for picking up an image of a fed component at a feed position of the component is positioned in a direction extending generally along a surface of the board and perpendicular to the array direction of the individual component holding members, against the support center of any component holding members out of the individual component holding members arrayed in line. As a result of this, the component mounting head having the individual component holding members arrayed in line can be reduced in width in the array direction. That is, the move range of the component mounting head can be reduced in size in the array direction, as compared with such the case where the component recognition unit is positioned in the array direction of the individual component holding members. With such reduction in size, the move range of the component mounting head in the array direction by the moving unit can be made smaller, allowing the component mounting apparatus having such a component mounting head to be reduced in size and allowing the productivity for component mounting to be enhanced.

Further, by the arrangement that any one of the component holding members is the component holding member that is positioned at an end portion in the component holding members arrayed in line, the positioning of the component recognition unit never causes a deterioration of maintainability for the component holding members and the up/down drive units, thus allowing a successful state to be maintained.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
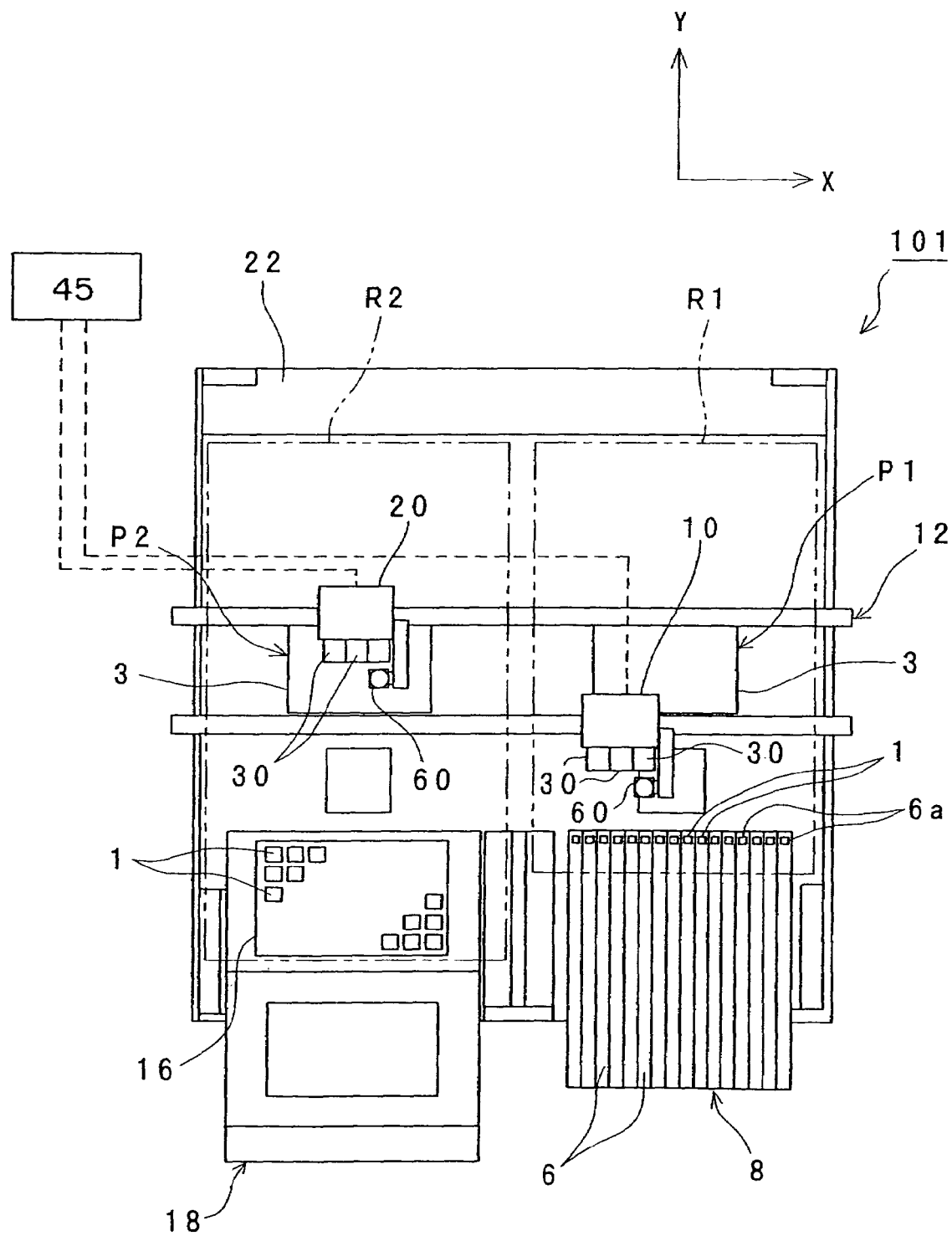
FIG. 1 is a schematic plan view of a component mounting apparatus according to a first embodiment of the present invention.

Before the description of the present invention proceeds, it is to be noted that like parts are designated by like reference numerals throughout the accompanying drawings. Hereinbelow, one embodiment of the present invention is described in detail with reference to the accompanying drawings.

First Embodiment

Figure 2:
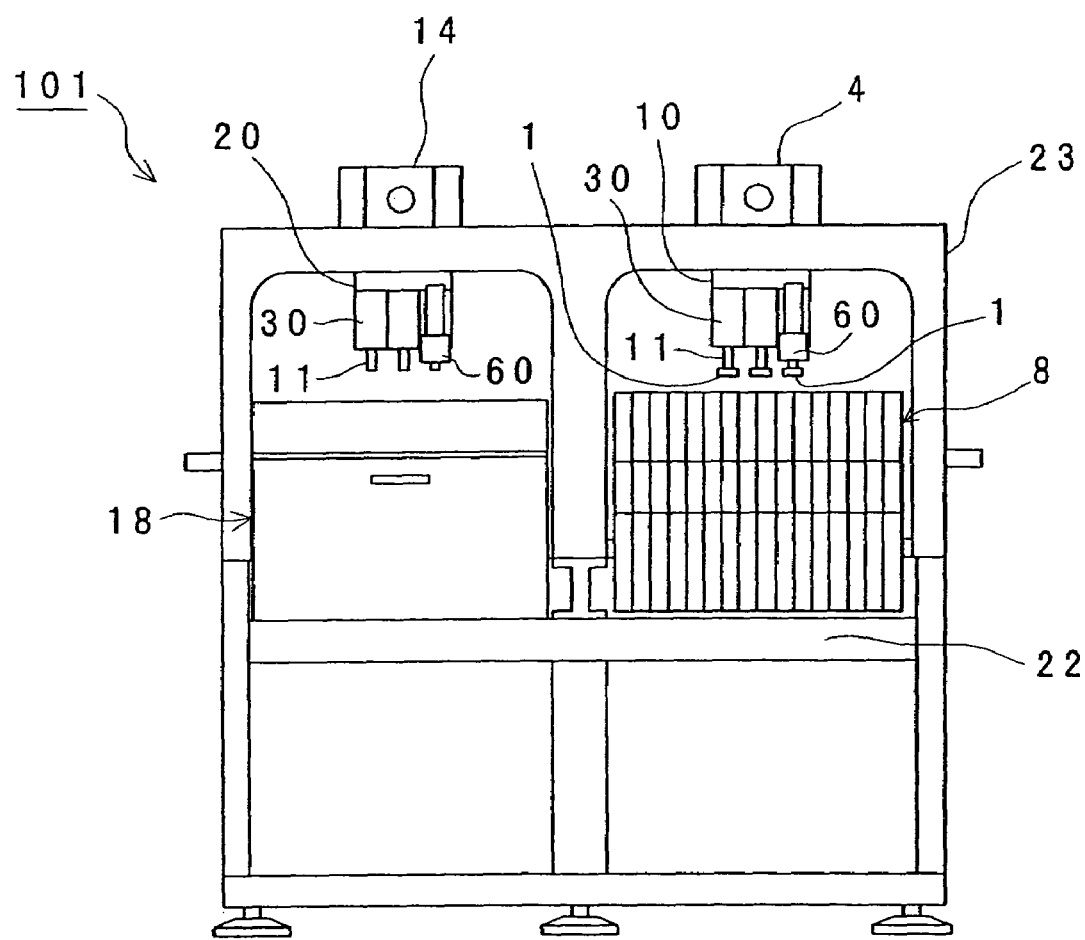
FIG. 2 is a schematic front view of the component mounting apparatus of FIG. 1.

FIG. 1 shows a schematic plan view of a component mounting apparatus 101 which is an example of a first embodiment of the present invention, and FIG. 2 shows a front view thereof.

The component mounting apparatus 101 is an apparatus for performing a component mounting operation of handling and picking up a component, which is extractably fed from a component feed unit, by a head unit, and mounting the held component to a component mounting position on a board held at a board holding position. More specifically, as shown in FIGS. 1 and 2, the component mounting apparatus 101 includes two component feed units, two board holding positions, and two head devices 10 and 20 each of which is provided corresponding to the individually each of the two component feed units and board holding positions. Further, the component mounting apparatus 101 includes a mounting operation region R1 where component mounting operation is carried out by the head device 10 and a mounting operation region R2 where component mounting operation is carried out by the head device 20.

As shown in FIGS. 1 and 2, in the mounting operation region R1 of the component mounting apparatus 101 is provided a cassette component feeder 8 which is an example of the component feed unit having a plurality of component feed cassettes 6 that extractably accommodate a plurality of components 1 therein and that set the accommodated components 1 positioned at component feed positions 6a and fed so as to be able to be picked up by the head device 10. Also, in the mounting operation region R2 is provided a tray component feeder 18 which is an example of the component feed unit that has a component feed tray 16 in which a plurality of components 1 are extractably set. An example of the components fed from the cassette component feeder 8 is chip type electronic components or the like, and an example of the components fed from the tray component feeder 18 is semiconductor built-in components typified by IC components or the like. In addition, the components may include mechanical components, optical components or the like in addition to electronic components.

In the component mounting apparatus 101, the individual mounting operation regions R1 and R2 are positioned in adjacency to each other, and a board conveyance unit 12 (an example of the board holding unit) for conveying a board 3 is positioned and included so as to cross those individual mounting operation regions R1 and R2. Further, a board holding position P1 at which the board 3 conveyed to the mounting operation region R1 is releasably held is set on the board conveyance unit 12 generally near a center of the mounting operation region R1. Also, a board holding position P2 at which the board 3 conveyed to the mounting operation region R2 is releasably held is set on the board conveyance unit 12 generally near a center of the mounting operation region R2. It is noted that such boards as shown above includes circuit boards such as resin boards, paper-phenol boards, ceramic boards, glass-epoxy boards or film boards, circuit boards of single-layer boards or multilayer boards, and objects having circuits formed thereon such as components, housings, or frames.

As shown in FIG. 2, above a base 22 on which the board conveyance unit 12, the cassette component feeder 8 and the tray component feeder 18 in the component mounting apparatus 101 is provided an frame 23 which is integrally formed of a rigid material. This frame 23 supports and includes an XY robot 4 which is an example of a head moving unit that, in the mounting operation region R1, supports the head device 10 and moves the head device 10 in an X-axis direction or a Y-axis direction as viewed in the figure, which are directions extending generally along the surface of the board 3, and an XY robot 14 which is an example of a head moving unit that, in the mounting operation region R2, supports the head device 20 and moves the head device 20 in the shown X-axis direction or the Y-axis direction. It is noted that the shown X-axis direction and the Y-axis direction in the figure are perpendicular to each other.

Figure 3:
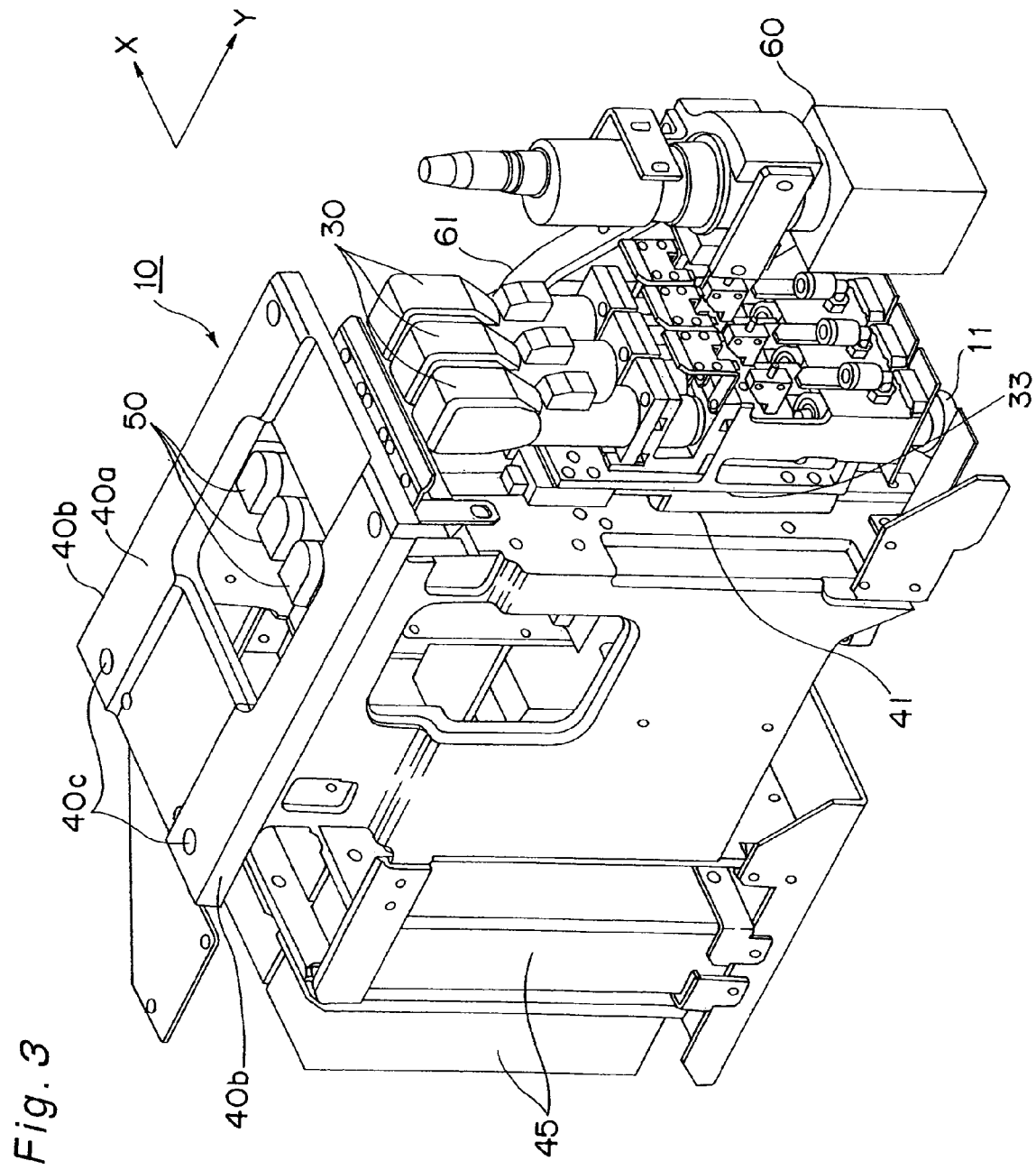
FIG. 3 is an appearance perspective view of a head unit (IC component mounting head) to be removably included in the component mounting apparatus of FIG. 1.

Construction of the head device 10 and the head device 20 in the component mounting apparatus 101 having such a construction as shown above is described in detail below. Since the head devices 10 and 20 are similar in construction to each other, the head device 10 will be described representatively in the following description. FIG. 3 shows a schematic perspective view of the head device 10.

As shown in FIG. 3, the head device 10 includes a plurality, e.g. three, of head-body units 30 each having a suction nozzle 11 which is an example of the component holding member for releasably sucking and holding a component. That is, the head device 10 includes three suction nozzles 11. The head device 10 also includes a main frame 40 (being an example of the support member) which is a housing for supporting each head-body unit 30, where the head device 10 can be removably fitted to the XY robot 4 by a fitting portion 40a provided on the top face of the main frame 40. Also, as shown in FIG. 3, the main frame 40 has a hollow, generally prismatic configuration, and the individual head-body units 30 are so arranged that their individual suction nozzles 11 are arrayed in a line at a constant spacing pitch along the shown X-axis direction on the shown front-face side out of the outer circumferential side faces of the main frame 40 (i.e., on the shown right side in the Y-axis direction in the figure).

Figure 4:
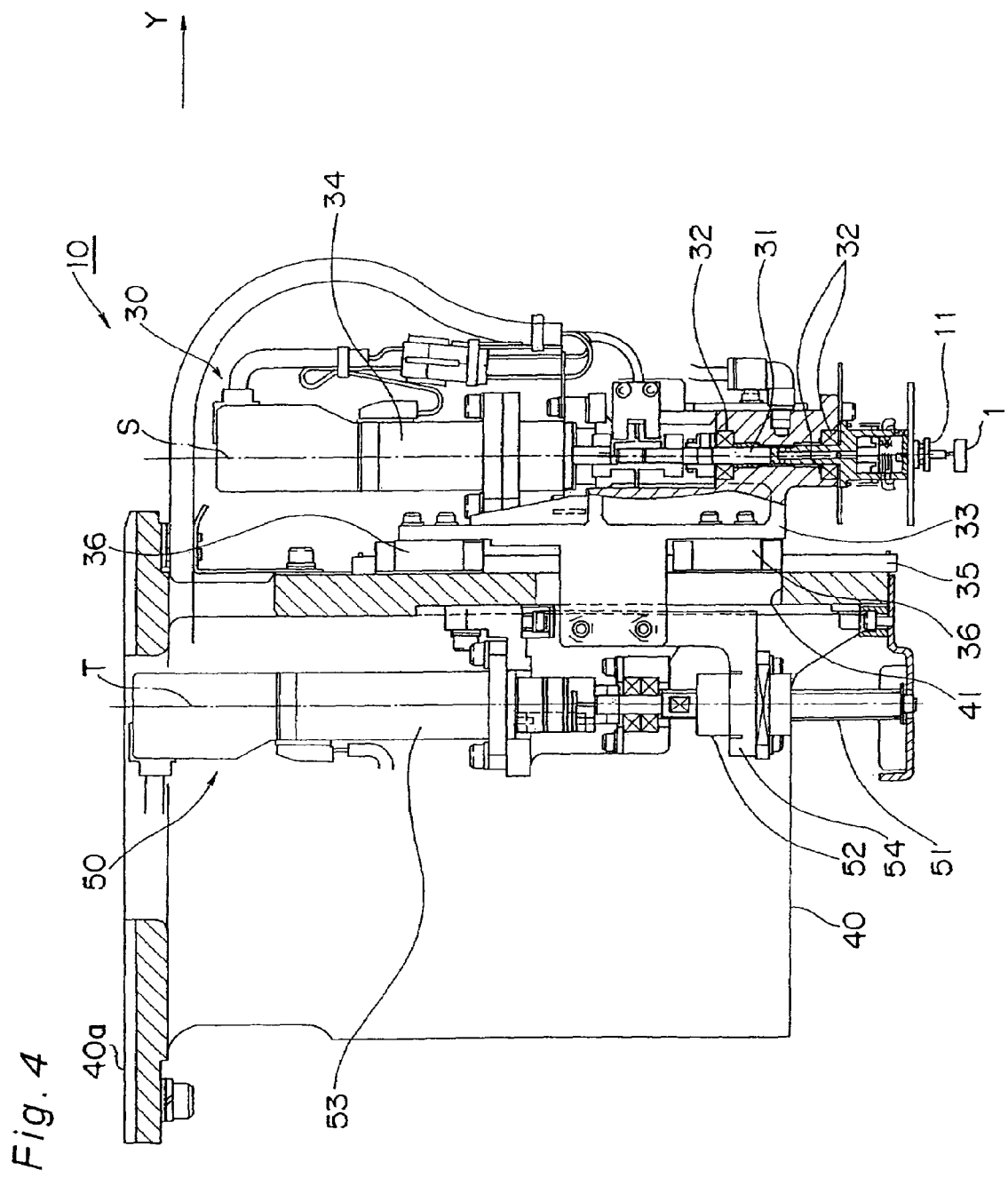
FIG. 4 is a partial sectional view of the head unit of FIG. 3.

Now a sectional view (partial sectional view) of the head device 10 of FIG. 3 in perpendicularity to the shown X-axis direction is shown in FIG. 4. As shown in FIGS. 3 and 4, each head-body unit 30 includes the suction nozzle 11 for releasably sucking and holding a component 1 at its lower tip end portion, a shaft 31 which is removably equipped with the suction nozzle 11 at its lower tip end portion, a plurality of bearing portions 32 which rotatably support the shaft 31 about a rotational center given by an axial center S of the generally vertically positioned shaft 31, a head frame 33 to which the bearing portions 32 are fixed and which supports the shaft 31 via the individual bearing portions 32, and a rotation drive motor 34 which is coupled to an upper end of the shaft 31 and for driving a rotational movement of the shaft 31 about its axial center S, where each head-body unit 30 is made up as an integral independent assembly unit. By the individual head-body units 30 having such a construction, the rotation drive motor 34 is enabled to drive the shaft 31 into rotation either forward or reverse about the axial center S under the control for the drive amount therefor so that the suction nozzle 11 can be rotationally moved either forward or reverse to a specified angle about the axial center S. Such a rotational move of the suction nozzle 11 is carried out as an operation for correcting a positional difference, if any, between a sucking-and-holding posture of a component sucked and held by the suction nozzle 11 and a mounting posture of the component onto the board. It is noted that the axial center S of the shaft 31 is generally coincident with the axial center of the suction nozzle 11.

Also, as shown in FIGS. 3 and 4, an LM rail 35 is set and fixed vertically, as viewed in the figure, on the front face of the main frame 40, and further two LM blocks 36 are movably engaged with the LM rail 35 along the LM rail 35 (i.e., in the vertical direction). Also, each LM block 36 is fixed to the head frame 33, by which the head frame 33 is supported by the main frame 40 so as to be movable in the vertical direction, which is a direction in which the LM rail 35 is positioned. That is, the head-body unit 30 as a whole is supported by the main frame 40 so as to be movable in the vertical direction (i.e., up/down movable). It is noted that the individual head-body units 30 are set up/down movable independently of each other.

Figure 5:
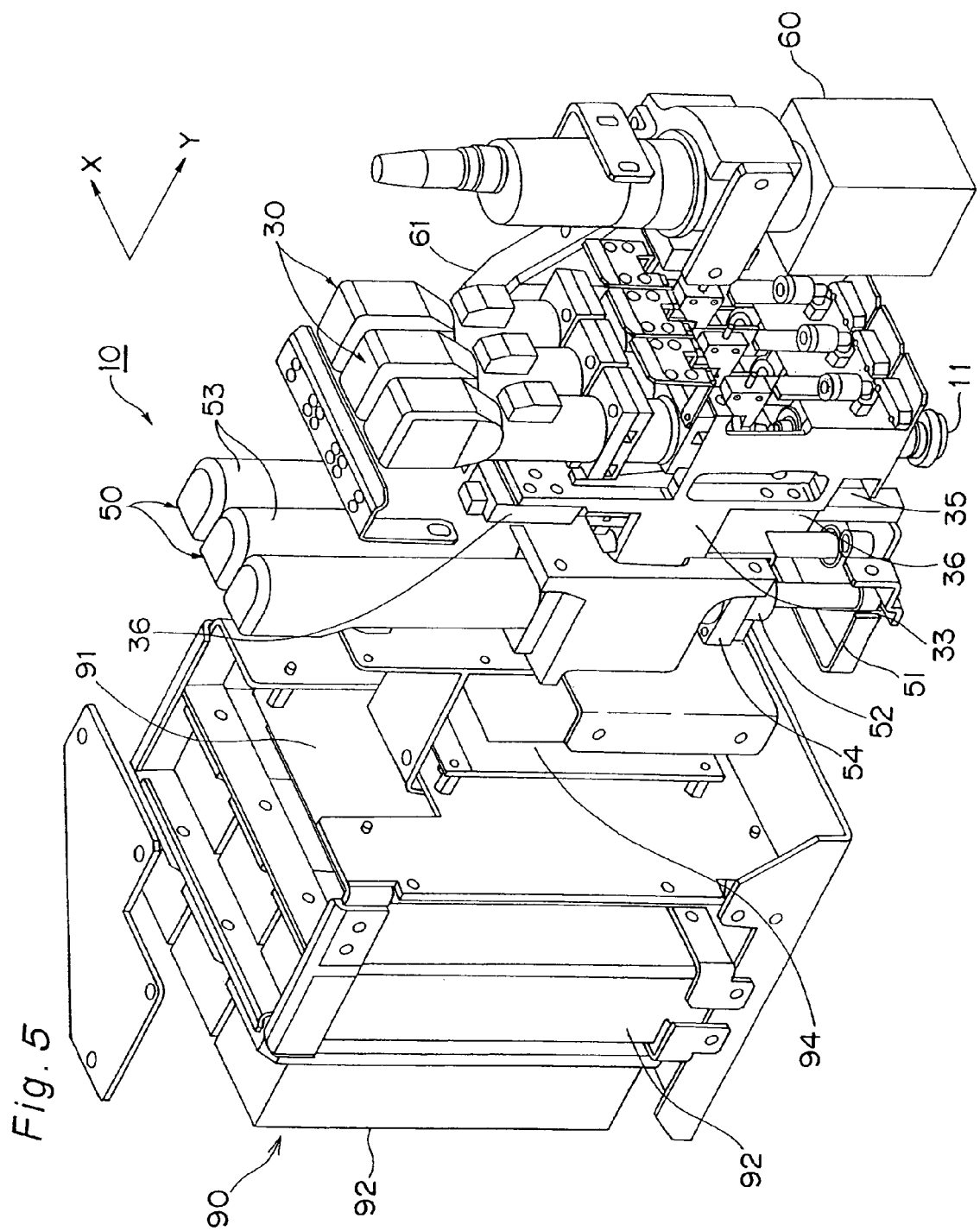
FIG. 5 is a partial seen-through perspective view of the head unit of FIG. 3 as viewed through the main frame.

As shown in FIG. 4, three up/down units 50, which are one example of the up/down move drive unit for performing the up/down operation of the head-body units 30, i.e. the up/down operation of the suction nozzles 11, are supported and included inside the main frame 40 so as to correspond to the individual head-body units 30, respectively. Each of the up/down units 50, which are positioned generally along the vertical direction, includes a ball screw shaft 51 supported by the main frame 40 so as to be rotatable about a rotational center, i.e. an axial center T of the ball screw shaft 51, a nut portion 52 screwed with the ball screw shaft 51, and a up/down drive motor 53 which is coupled to an upper end of the ball screw shaft 51 and which is an example of the drive motor for driving rotational movement of the ball screw shaft 51 either forward or reverse about the axial center T. Further, a coupling bar 54, which is an example of a coupling member having a generally L-like shape, is fixed to a nut portion 52, and the coupling bar 54 is fixed to the head frame 33 in its corresponding head-body unit 30. As a result of this, the head frame 33 and the nut portion 52 are coupled to each other via the coupling bar 54. In addition, the individual head-body units 30 are supported by the front-face member, which is at least part of the main frame 40, and the individual up/down units 50 are supported by the inside of that member of the main frame 40. That is, with the front-face member of the main frame 40 interposed therebetween, the individual head-body units 30 and the up/down units 50 are set and supported by that member. With regard to the head device 10 shown in FIG. 3, FIG. 5 shows a perspective view of the head device 10 as viewed through the main frame 40. As shown in FIG. 5, the individual up/down units 50 are arrayed in a line at a specified spacing pitch (equal to the spacing pitch of the head-body units 30) along the X-axis direction, as the individual head-body units 30 are arrayed.

With such constructions of the up/down units 50 and the head-body units 30 as shown above, rotational drive for the ball screw shaft 51 is exerted by the up/down drive motor 53 of the up/down unit 50, by which the nut portion 52 is moved up or down along the axial center T of the ball screw shaft 51. Thus, the head frame 33 coupled to the nut portion 52 via the coupling bar 54 can be moved up or down along the axial center S of the shaft 31 while being guided by the LM rail 35 and the LM blocks 36. By this moving-up and -down operation of the head frame 33, the head-body unit 30 as a whole can be moved up and down integrally. More specifically, by move-down of the head-body unit 30, a move-down operation of the suction nozzle 11 positioned above the component feed position 6a of the cassette component feeder 8 can be performed, by which a lower end of the suction nozzle 11 is brought into contact with the component positioned at the component feed position 6a, thus allowing the component to be sucked and held. Also, by move-up of the head-body unit 30, the suction nozzle 11 that has sucked and held the component can be moved up, allowing the component to be held and picked up from the component feed position 6a. Further, by such move-up and -down of the suction nozzle 11, the sucked-and-held component can be mounted to a mounting position for the component in the board 3. It is noted that since the moving-up and -down operation of the head frame 33 is performed as moving-up and -down operation for use of suction-and-pickup operation and mounting operation for the component by the suction nozzle 11, the range of the moving-up and -down operation is subject to such limitations that the corresponding operation can be carried out (i.e., upper- and lower-limit positions for move-up and -down) are provided. The axial center S of the shaft 31 serves also as a moving-up and -down operation axis of the suction nozzle 11.

A through window portion 41, which is an opening through which part of the head frame 33 coupled to the coupling bar 54 is to be inserted, is formed in the front face of the main frame 40. This through window portion 41 is so sized as not to inhibit the moving-up and -down operation of the head frame 33. That is, the through window portion 41 is formed with its configuration and size determined in order that peripheral portions of the through window portion 41 will not interfere with the head frame 33, no matter which position in the moving-up and -down operation range it is positioned.

Figure 6:
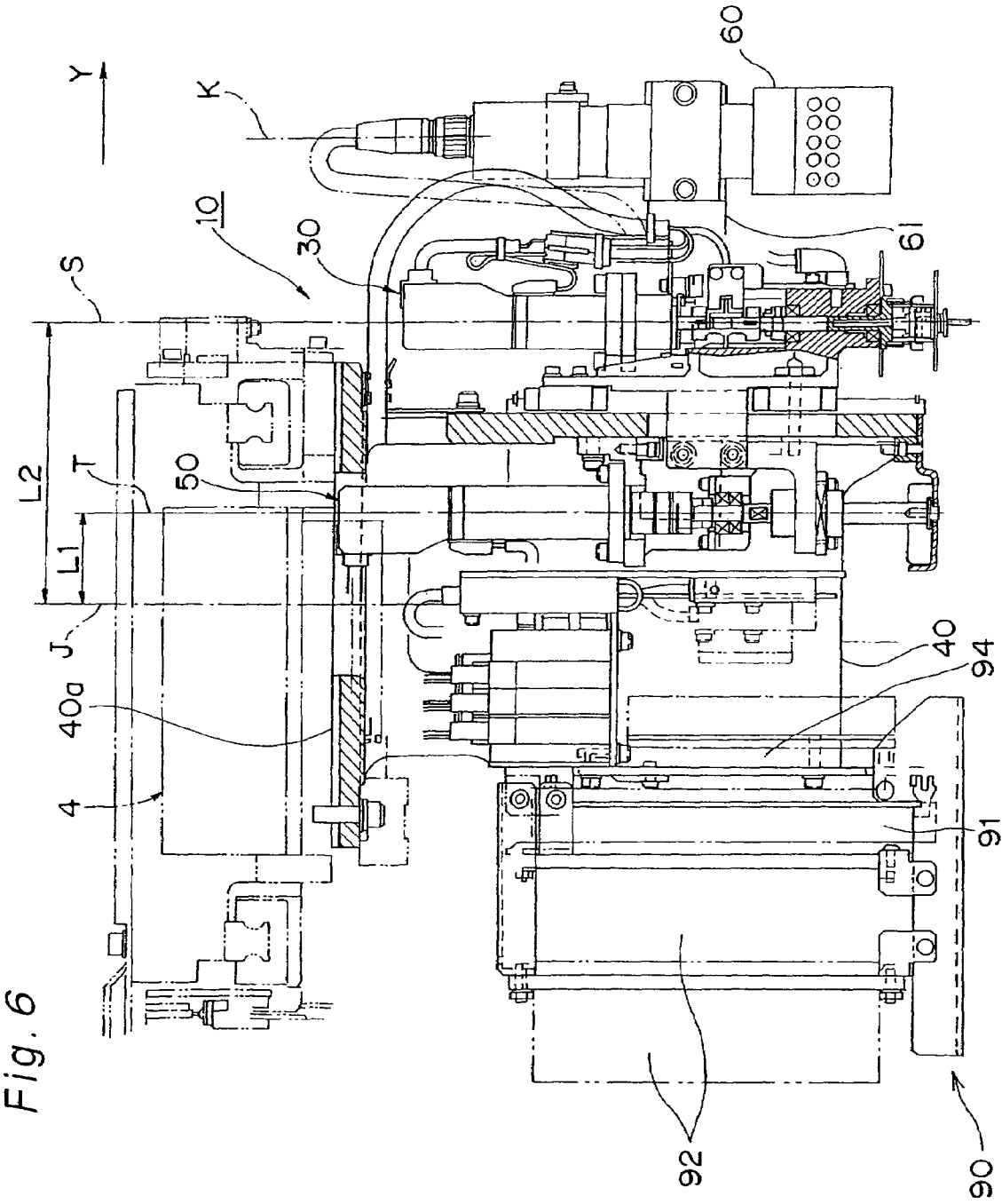
FIG. 6 is a sectional view of the head unit of FIG. 3.

Here, a sectional view of the head device 10 having the construction shown above in a state that the head device 10 is loaded onto the XY robot 4, in a section correspondence to FIG. 4, is shown in FIG. 6. As shown in FIG. 6, the head device 10 can be removably loaded to the XY robot 4 by the fitting portion 40a, which is an upper portion of the main frame 40. Also, the center position of the fitting portion 40a in the shown Y-axis direction serves as a support center J (fixation center) of the main frame 40 by the XY robot 4. Further, the support center in the shown Y-axis direction for the supporting of each up/down unit 50 to the main frame 40 is generally coincident with a mounting center of the axial center T (assumed as a support center T) of the ball screw shaft 51, while the support center in the shown Y-axis direction for the supporting of each head-body unit 30 to the main frame 40 is generally coincident with a placement center of the axial center S (assumed as support center S) of the shaft 31. As to the positional relationship among the individual support centers in the Y-axis direction, the support centers are so positioned that a distance L1 between the support center J of the main frame 40 by the XY robot 4 and the support center T of the up/down unit 50 becomes smaller than a distance L2 between the support center J of the main frame 40 and the support center S of the head-body unit 30.

A center-of-gravity position of the head device 10 in the shown Y-axis direction is generally coincident with the support center J of the main frame 40 to the XY robot 4, or is placed in the vicinity of the support center J. Therefore, in other words, as to the placement relationships among the individual support centers, it can also be said that the individual support centers are so placed that a distance between the center-of-gravity position of the head device 10 and the support center T of the up/down unit 50 becomes smaller than a distance between the center-of-gravity position and the support center S of the head-body unit 30.

With such individual placement relationships, in the head device 10, the up/down unit 50 having a characteristic that occurrence of a large thrust is involved in its driving can be positioned closer to the support center J of the main frame 40, so that the magnitude of the moment generated due to the occurrence of the thrust can be reduced.

Further, as shown in FIG. 1, the component mounting apparatus 101 has a control unit 45 which is an example of the main control unit for performing operations of the individual component sections as integrated control in association with one another. More specifically, the control unit 45 is capable of performing operation control for the holding-and-picking mounting operation of the component by the head devices 10, 20 in the component mounting apparatus 101, the moving operation of the head devices 10, 20 by the XY robots 4, 14, respectively, the component feed operation by the cassette component feeder 8 and the tray component feeder 18, the carrying-in and -out operation of the board by the board conveyance unit 12, and the like, integrally in association with one another, thus make it possible to exert the control for the component mounting operation that a fed component is mounted onto the board. It is noted that the control unit 45 is provided on the apparatus body side in the component mounting apparatus 101.

Now referring to FIG. 7, which is a control block diagram schematically showing the control-related structure of the component mounting apparatus 101 having the construction shown above, the control-related structure is described below.

Figure 7:
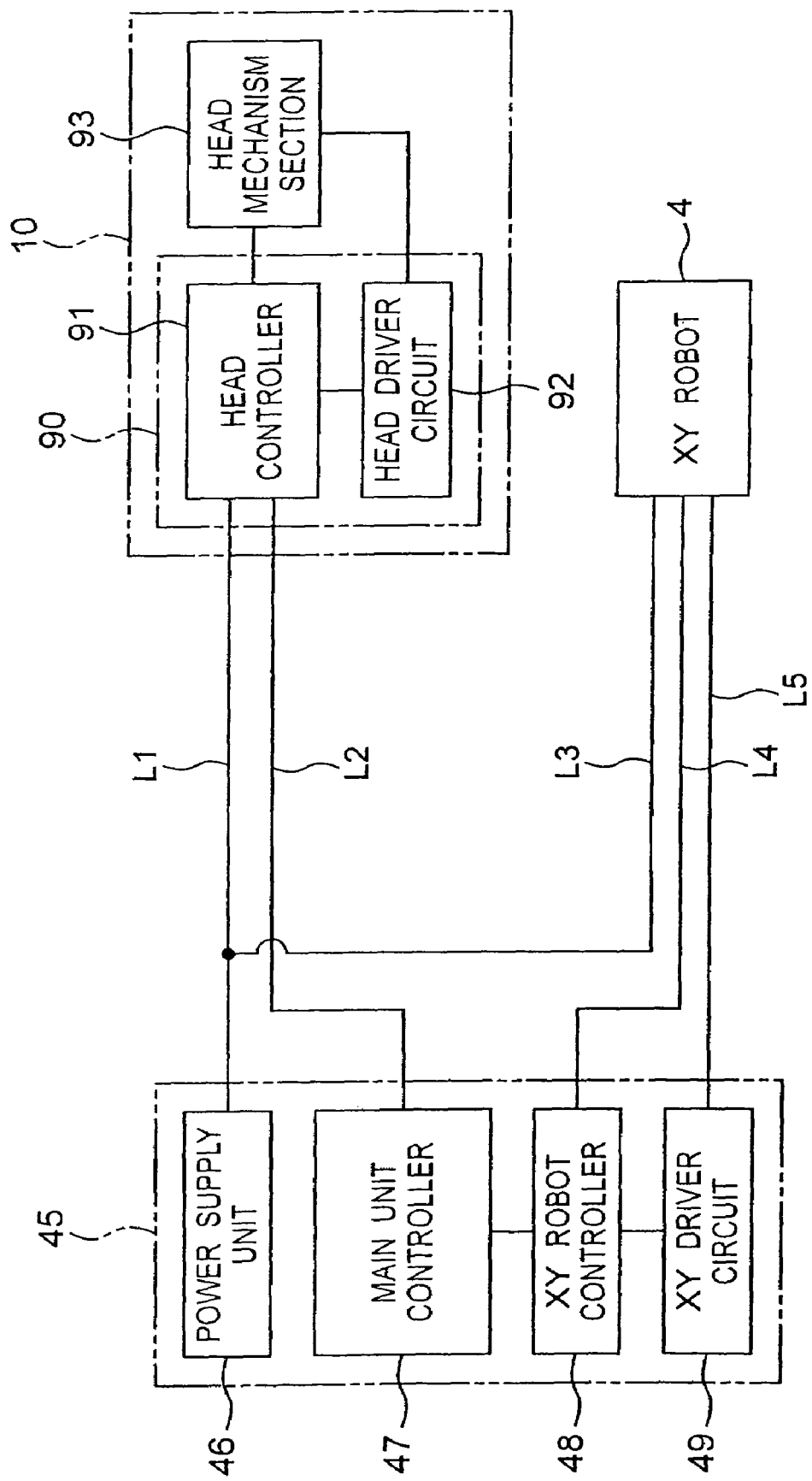
FIG. 7 is a control block diagram showing a control-related structure in the component mounting apparatus of the first embodiment.

As shown in the control block diagram of FIG. 7, the head device 10 of the component mounting apparatus 101 includes a head mechanism section 93 having component-parts for performing mechanical operation of the head unit (e.g., the individual head-body units 30 for performing rotational movement of the individual suction nozzles 11, and the up/down units 50 for performing their up/down move), and a head control unit 90 for performing operation control for the head mechanism section 93. In the head control unit 90 are provided a plurality of control circuit boards that constitute a control circuit for performing control processing therefor. As such control circuit boards are given a head driver circuit 92 for driving individual operations of the head mechanism section 93, and a head controller 91 for performing control over operations of the head driver circuit 92 and the head mechanism section 93 to thereby perform operation control for the head mechanism section 93. Also, the control unit 45 provided to the apparatus main body side of the component mounting apparatus 101 includes a power supply unit 46 for feeding electric power for control or drive on the head controller 91 and driver 92 in the head control unit 90 as well as on the head mechanism section 93, and a main apparatus controller 47 for performing operation control over the head device 10 by the head control unit 90 as integrated control in association with the operations of the other constituent sections in the component mounting apparatus 101. Further, the control unit 45 includes an XY driver circuit 49 for driving the operation of the XY robot 4, and an XY robot controller 47 for performing operation control over the XY driver circuit 49 and the XY robot 4. It is noted that the XY robot controller 48 and the XY driver circuit 49 are an example of the moving-unit control unit in this first embodiment.

Between the control unit 45 and the head control unit 90, and between the control unit 45 and the XY robot 4, are provided a plurality of interconnection lines for their interconnections, respectively. More specifically, between the head device 10 and the control unit 45 are provided power line(s) L1 for connecting the head controller 91 and the power supply unit 46 to each other to feed power for drive or control of the head device 10, and communication line(s) L2 which is(are) an example of communication means for connecting the head controller 91 and the main apparatus controller 47 to transfer information for use of associating operation control of the head device 10 with operations of the other constituent sections, e.g., the XY robot 4. Further, between the XY robot 4 and the control unit 45 are provided power line(s) L3 for connecting the XY robot 4 and the power supply unit 46 to each other to feed electric power for drive of the XY robot 4, I/O line(s) L4 for connecting the XY robot 4 and the XY robot controller 48 to each other to perform transmission of control information therebetween, and motor line(s) L5 for connecting the XY robot 4 and the XY driver circuit 49 to each other to perform transmission of signals relating to the drive of the XY robot 4. It is noted that the individual interconnection lines between the head device 10 and the control unit 45 are provided, for example, as two power lines L1 and two communication lines L2. In the component mounting apparatus 101, the head device 20 and the XY robot 14 are also included in addition to the head device 10, and the control unit 45 is electrically and controllably connected to these as well, thus enabled to exert integrated control in association among their mutual operations. However, since the head device 20 and its control-related structure including the X-Y robot and the control unit 45 are the same as the above-described control-related structure, the control-related structure including the head device 20 or the like is omitted in the control block diagram shown in FIG. 7 for an easier understanding of its description.

As shown in FIGS. 5 and 6, the head control unit 90 is placed on the shown left side of the head device 10, and supported by the main frame 40 so as to be movable integrally with the head device 10. Further, the control circuit boards of the head driver circuit 92 and the like are so arrayed that their respective surfaces become parallel to one another. For instance, the control circuit boards are arrayed in such a manner that their surfaces become generally perpendicular to the surface of the board 3 (i.e., generally perpendicular to a plane formed by the shown X and Y axes). In more detail, the control circuit boards are so arrayed that their respective surfaces are generally perpendicular to the shown Y-axis direction, resulting in an array of a plurality of head driver circuits 92, the head controller 91 and an I/O unit 94, in this order, as listed from left to right side along the shown Y-axis direction. It is noted that the I/O unit 94 has an information inputting/outputting function for performing input of information from the main apparatus controller 47 to the head controller 91 as well as output of information from the head controller 91 to the main apparatus controller 47. Also, gaps of a specified size are provided between the control circuit boards. The provision of such gaps allows air of the individual gaps to be naturally ventilated, so that calories generated from the individual control circuit boards during control operation or the like can be removed, hence efficient cooling of the individual control circuit boards. In particular, the mounting of the individual gaps extending in the vertical direction between the individual control circuit boards makes it possible to utilize the ascending air current due to the generated calories, with a result of more efficient natural ventilation. It is noted that the individual gaps serve as an example of the ventilation voids in this first embodiment.

As shown in FIGS. 3 and 6, the head device 10 includes a component image pickup camera 60 which is an example of the component recognition unit for picking up an image of a component extractably set at the component feed unit, for example, at each component feed position 6a of the cassette component feeder 8 to thereby recognize a position of the component in the X-axis direction or Y-axis direction. As shown in FIG. 6, the component image pickup camera 60 is located on the shown right side of the head-body unit 30 in the Y-axis direction. More specifically, as shown in FIG. 1, the component image pickup camera 60 is located so as to be adjacent in the Y-axis direction to the head-body unit 30 which is located at an end portion, for example, located at a shown right-side end portion in the X-axis direction out of the three head-body units 30 arrayed in line along the X-axis direction. That is, the support center S of the head-body unit 30 positioned at the end portion, the support center T of the up/down unit 50 corresponding to the relevant head-body unit 30, and an image pickup center K of the component image pickup camera 60 are arrayed in a line along the Y-axis direction.

Also, as shown in FIGS. 1, 3 and 6, the component image pickup camera 60 is supported on the main frame 40 of the head device 10 via a camera support frame 61. Also, as shown in FIG. 3, in consideration of maintainability of the individual head-body units 30 positioned rather on the right side in the shown Y-axis direction, the camera support frame 61 is placed beside the head-body unit 30 placed at the end portion (on the shown right side in the X-axis direction).

The fitting height of the component image pickup camera 60 to the main frame 40 is set to such a height position that the lower end of the component image pickup camera 60 does not interfere with the cassette component feeder 8 even if any of the suction nozzles 11 of the head devices 10 is positioned above the individual component feed positions 6a of the cassette component feeder 8.

Image data of a component picked up by the component image pickup camera 60 is outputted to the control unit 45 of the head device 10, and subjected to recognition process of the image by the control unit 45. Then, the position of the component is recognized based on a result of that recognition process, and thus correction for the movement position of the head device 10 by the XY robot 4 (i.e., a movement that allows the suction nozzle 11 to be positioned securely above the component) is enabled. In addition, it is also enabled to control the image pickup operation of the component image pickup camera 60 by the control unit 45.

Next, the fitting structure of the head device 10 to the XY robot 4 in the component mounting apparatus 101, as well as the fitting structure of the head device 20 to the XY robot 14, are explained. Since these members are similar in fitting structure to each other, the fitting structure of the head device 10 to the XY robot 4 will be described representatively.

Figure 8:
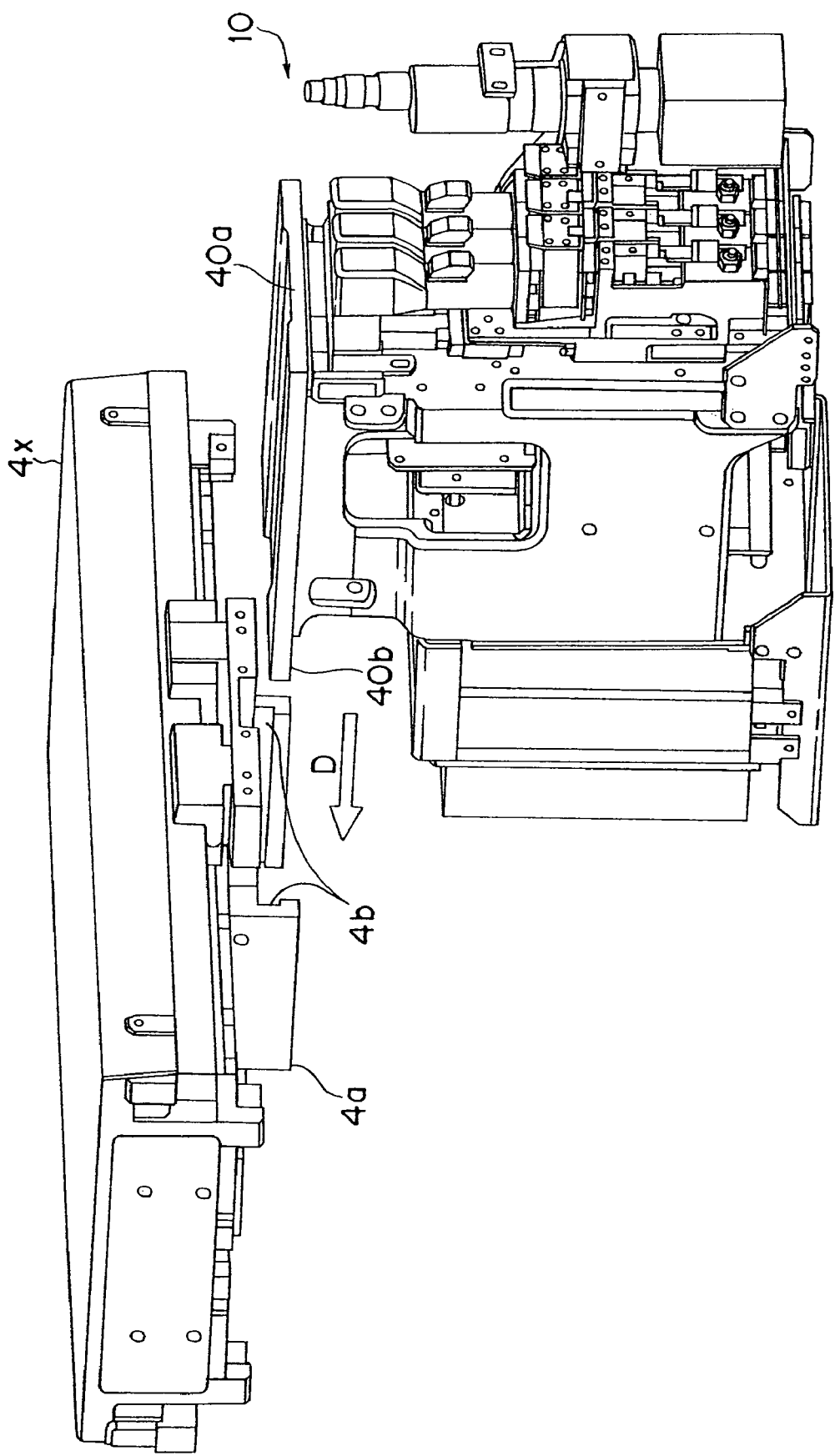
FIG. 8 is a perspective view showing a state immediately before the loading of the head unit of FIG. 3 onto the X-Y robot.
Figure 9:
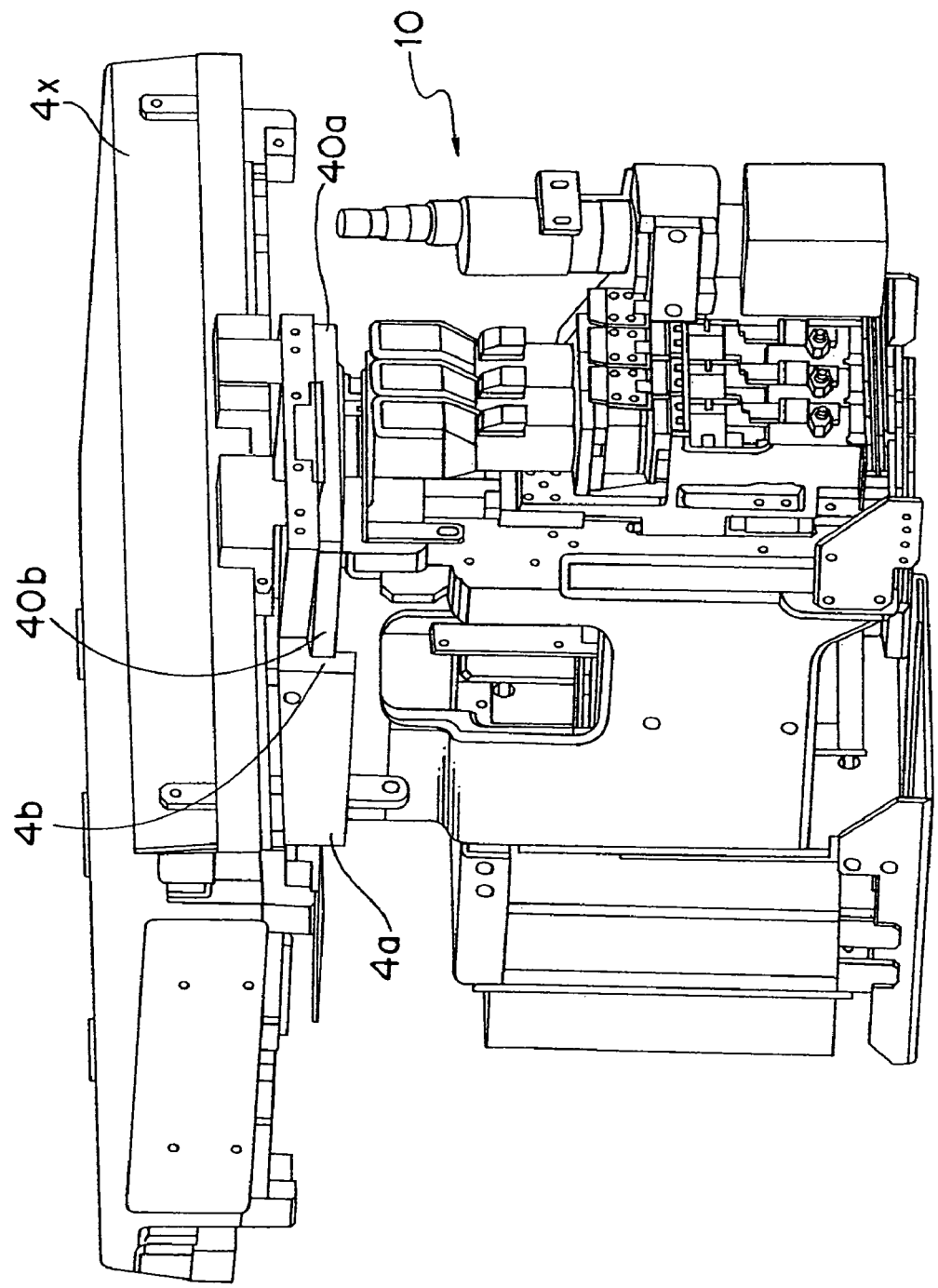
FIG. 9 is a perspective view showing a state that the X-Y robot has been loaded with the head unit.

FIG. 8 is a schematic perspective view of the XY robot 4 and the head device 10, showing a state immediately before the head device 10 is fitted to the XY robot 4. FIG. 9 is a schematic perspective view showing a state that the head device 10 has been fitted to the XY robot 4. As shown in FIG. 8, a head fitting portion 4a which can be removably fittable and fixable to the fitting portion 40a formed in an upper portion of the main frame 40 of the head device 10 is provided on a lower face of an X-axis robot 4x that serves for the move mounting operation in the X-axis direction out of mounting operations in the X-axis direction or the Y-axis direction of the head device 10 by the XY robot 4.

Meanwhile, the fitting portion 40a, which is an upper portion of the main frame 40 of the head device 10 as shown in FIG. 3, has a generally square-shaped planar configuration formed along the shown Y-axis direction, and at its end portions in the shown X-axis direction, flange-shaped flange portions 40b are formed, respectively, along the shown Y-axis direction. Further, as shown in FIG. 8, in the head fitting portion 4a of the X-axis robot 4x, flange receiving portions 4b having a recessed cross-sectional configuration engageable with the individual flange portions 40b in the fitting portion 40a of the head device 10 are formed along the Y-axis direction. With the setting of such structures of the fitting portion 40a of the head device 10 and the head fitting portion 4a of the X-axis robot 4x, as shown in FIG. 8, moving the head device 10 toward a fitting direction D, which is a direction along the Y-axis direction, makes the flange portions 40b of the fitting portion 40a engaged with the flange receiving portions 4b of the head fitting portion 4a, respectively, and while the engaged state is held, sliding and moving the head device 10 toward the fitting direction D allows the head device 10 to be fitted as shown in FIG. 9.

Also, as shown in FIG. 3, bolt fitting holes 40c which are an example of the fixing portion are formed in vicinities of corner portions in the fitting portion 40a of the head device 10, respectively. In the engagement and fixation of the X-axis robot 4x to the head fitting portion 4a, a bolt or the like is inserted into the bolt fitting holes 40c (into any one of the bolt fitting holes 40c), by which the X-axis robot 4x can be removably fixed by the nut or the like. Also, for removal of the head device 10 fitted to the head fitting portion 4a of the X-axis robot 4x, the fixation by the bolts and the nuts is released and thereafter the head device 10 is slid and moved in a direction opposite to the fitting direction D shown in FIG. 8, by which the engagement of the fitting portion 40a with the head fitting portion 4a can be released, thus allowing the head device 10 to be removed from the XY robot 4. In addition, instead of the use of bolts or the like, pins or the like may be used. Further, in order that its fixing position to the head fitting portion 4a is maintained constant at all times, a regulating member for regulating the sliding position of each flange portion 40b may be further included in the head fitting portion 4a.

In the case of such loading and unloading of the head device 10 onto and from the XY robot 4 as shown above, the power line(s) L1 and the communication line(s) L2 for connecting the head control unit 90 provided in the head device 10 and control unit 45 provided on the apparatus main body side to each other can easily be connected and disconnected by using, for example, a connector or the like. It is noted that such power line(s) L1 and communication line(s) L2 are common interconnecting lines that are usable for different types of head units even when the head device 10 is changed to a different type of head unit and loaded as described later.

With the above-described structures given as the control-related structures for the head device 10, the XY robot 4 and the component mounting apparatus 101, it becomes possible to change the head device 10 equipped on the XY robot 4 to another head unit of a type different from the head device 10. In particular, substituting and loading a head unit capable of optimum mounting operation according to the type of the component to be mounted onto the board or the type of the board makes it possible to flexibly meet the mounting of diversified components. That is, the component mounting apparatus 101 is enabled to meet the mounting of diversified components by providing a plurality of types of head units corresponding to the types of components to be mounted onto the board and by selecting and loading one head unit out of these plurality of types of head units.

Here are explained some types of head units as an example of such a plurality of types of head units. In the component mounting apparatus 101, one head unit among the plurality of types of head unit is selected and loaded onto the XY robot, while head unit(s) of a type different from the one head unit out of the remaining plurality of head units after the selection of the one head unit are provided in such a standby state so as to be loadable to the XY robot. That is, in the component mounting apparatus 101, the head unit(s) of the different type is(are) provided on standby so as to be changeable with the selected one head unit.

First, the head device 10 (similar in structure to the head device 20) shown in FIG. 3 described above is an IC component mounting head 10, which is an example of the semiconductor component mounting head capable of mounting not only chip components but also IC components for which higher-precision mounting operation is demanded than the chip components. In the IC component mounting head 10 like this, a plurality (e.g., three) of suction nozzles 11 are included independently rotatably and up-and-down movably, so that correction operation for the sucking-and-holding posture of a sucked-and-held component or other operations can be performed according to individual conditions in terms of the holding state of the component or its mounting posture to the board or the like, thus allowing high-precision mounting of components to the board to be implementable. It is noted that such an IC component mounting head 10, although usable for mounting operation for not only IC components but also chip components, yet particularly preferably usable for the mounting of chip components on which more importance is given to mounting precision rather than to mounting speed.

Figure 10:
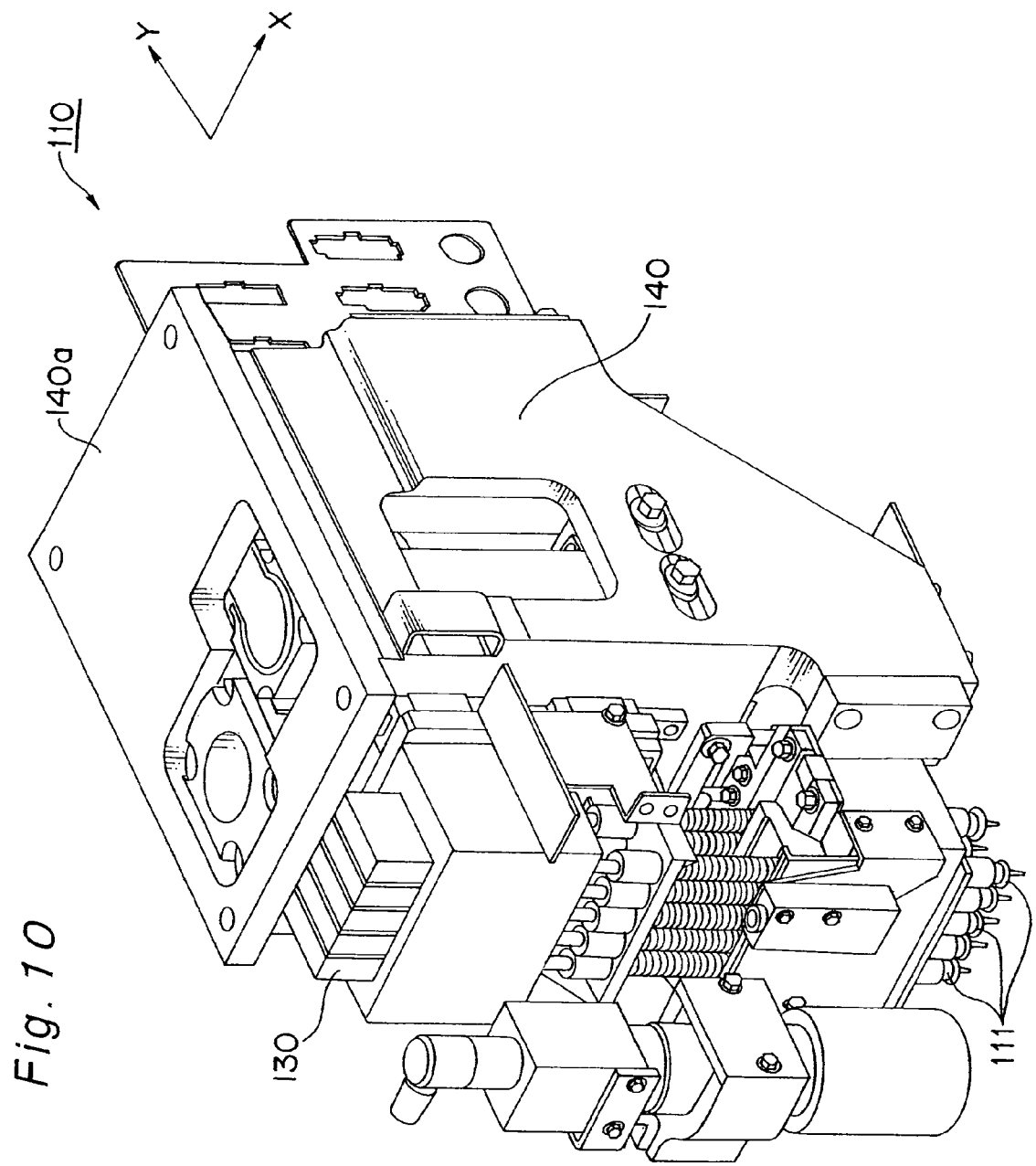
FIG. 10 is a perspective view showing a head unit of a type (chip-component mounting head) different from the head unit of FIG. 3.

Next, FIG. 10 shows a chip component mounting head 110, which is an example of the plurality of types of head units. As shown in FIG. 10, a fitting portion 140a, which is to be removably fitted to the head fitting portion 4a of the XY robot 4, is formed at a top portion of a main frame 140 of the chip component mounting head 110, as in the case of the IC component mounting head 10, thus making it possible to removably load the fitting portion 140a to the XY robot 4. Also, on a shown front side of the main frame 140, a plurality, e.g. ten, of suction nozzles 111 are arranged in two arrays (i.e., two rows of five nozzles each) along the X-axis direction. The main frame is also provided with an up/down unit 130 for moving up and down the individual suction nozzles 111 independently, and moving-up and -down operation of a relevant suction nozzle 111 is performed by the up/down unit 130 for suction and pickup of a fed chip component, mounting operation of the sucked-and-held chip component onto the board, and the like. The chip component mounting head 110 including a multiplicity of suction nozzles 111 as shown above is called, in some cases, multi-nozzle head unit, and capable of collectively sucking and holding a plurality of chip components concurrently by the plurality of suction nozzles 111 and mounting the sucked-and-held chip components onto the board continuously. In addition, although not shown in FIG. 10, a head control unit is supported and included on the right sides (i.e., depth side) of the main frame 140 in the shown Y-axis direction. In this head control unit, individual control circuit boards are provided and arranged so as to be generally perpendicular to the surface of the board, as in the case of the IC component mounting head 10 (that is, the individual control circuit boards are provided so as to be arranged generally perpendicularly to the Y-axis direction).

In the component mounting apparatus 101, the chip component mounting head 110 can be loaded onto the XY robot 4 by the same procedure as in the loading and unloading of the IC component mounting head 10 shown in FIGS. 8 and 9. Also, when connectors or the like provided for the power line(s) L1 and the communication line(s) L2 for use of connection between the head control unit of the chip component mounting head 110 and the control unit 45 provided on the apparatus main body side are connected to the head control unit, electrical and control-related connections involved can be fulfilled. Further, the individual interconnection lines for the power line(s) L1 and the communication line(s) L2 provided in the component mounting apparatus 101 are usable in common regardless of the type of the head unit, so that even loading of the chip component mounting head 110 does not involve changing work for the individual interconnection lines. Thus, substituting and loading the chip component mounting head 110 makes it possible to prepare for mounting operation for chip components that demands mounting speed or efficiency rather than mounting precision therefor. In addition, for example, when the selected one head unit is the IC component mounting head 10, the head unit of the different type may be a chip component mounting head of a type different from the IC component mounting head.

Figure 11:
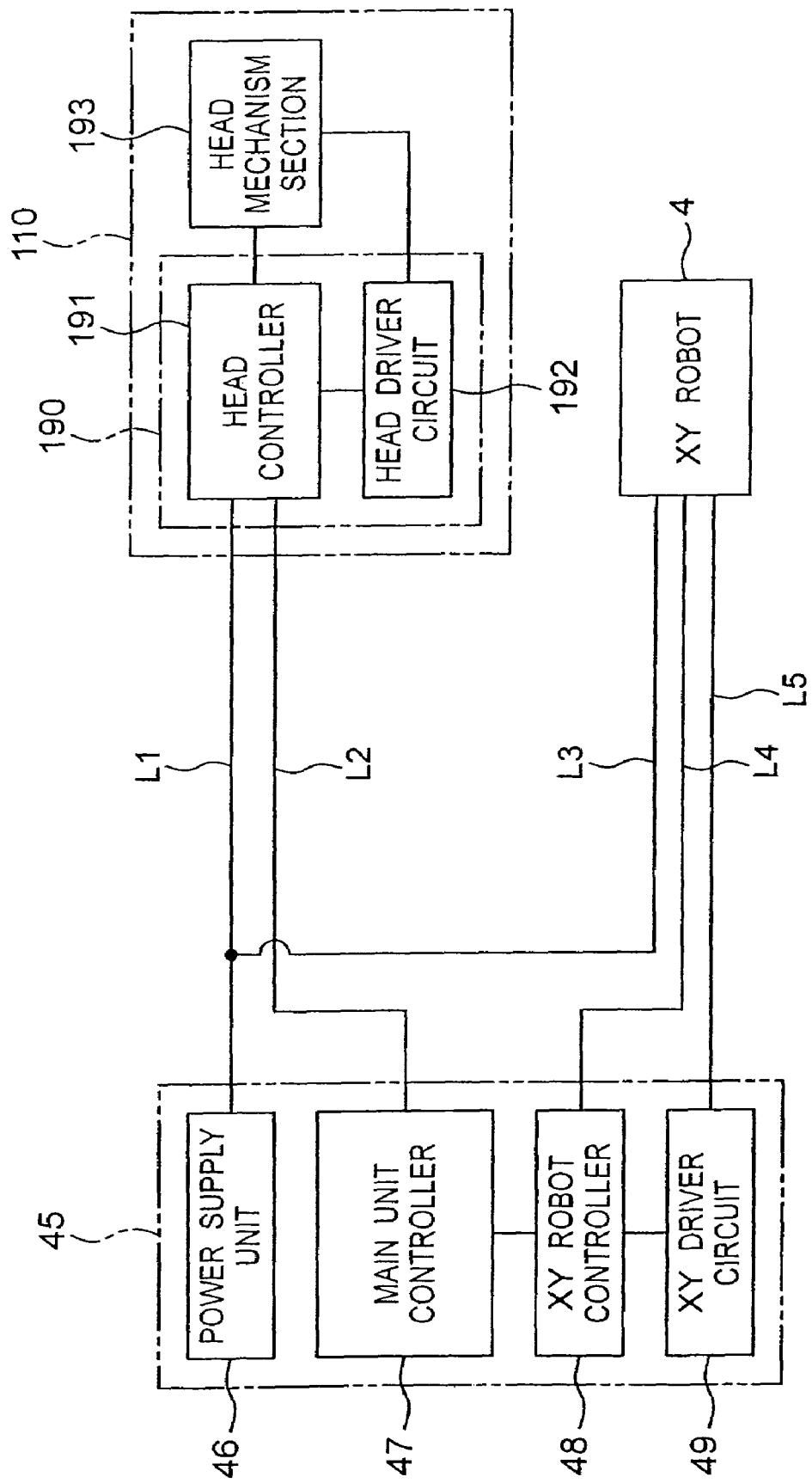
FIG. 11 is a control block diagram showing a control-related structure of the component mounting apparatus in a case where the component mounting apparatus is loaded with the chip-component mounting head of FIG. 10.

FIG. 11 shows a control block diagram corresponding to the control block diagram of FIG. 7 in the case where the chip component mounting head 110 is substituted and loaded to the XY robot 4 in the component mounting apparatus 101. As shown in FIG. 11, the chip component mounting head 110 includes a head mechanism section 193 such as an up/down unit 130, a head driver circuit 192 which is an example of the control circuit board and which performs drive of the head mechanism section 193, and a head controller 191 which is similarly an example of the control circuit board and which performs control for the head mechanism section 193 and the head driver circuit 192, where the head controller 191 and the head driver circuit 192 constitute a head control unit 190. The head controller 191 in the head control unit 190 and the power supply unit 46 are connected to each other by power line(s) L1, allowing drive- or control-use electric power to be supplied from the power supply unit 46 to the chip component mounting head 110. Further, the main apparatus controller 47 controllably connected to the XY robot controller 48 and the head controller 191 are connected to each other by the communication line(s) L2, enabling the main apparatus controller 47 to exert integrated control based on information transferred from the head controller 191 and the XY robot controller 47 while their control operations are associated with each other.

The above description has been given on a case where the component mounting apparatus 101, in which the XY robot 4 is loaded selectively with either the IC component mounting head 10 or the chip component mounting head 110, performs mounting of fed chip components or IC components or the like onto the board. However, this embodiment is not limited to such a case only. For example, the case may be that an applicator-feeder head, which feeds solder paste or adhesive or other bonding material (material for mounting and bonding of the components to mounting positions on the board) to mounting positions for individual components on the fed board, is removably and selectively loaded to the XY robot 4. With the applicator-feeder head loaded to the XY robot 4 as shown above, for example, moving the applicator-feeder head in the X-axis direction or Y-axis direction by the XY robot 4 with respect to the board 3 held at the board holding position P1 makes it possible to obtain alignment between the component mounting position on the board 3 and the applicator-feeder head to be fulfilled, and to feed solder paste or adhesive or the like to the mounting position. Accordingly, in the component mounting apparatus 101, the operating region where the applicator-feeder head is provided can be made to serve as an application and feed operating region.

Referring to a concrete example for explanation, in the component mounting apparatus 101 shown in FIG. 1, a operating region (i.e., mounting operation region R1) on the shown right side is taken as an application and feed operating region, and a operating region on the shown left side is taken as a mounting operation region R2. Then, with respect to the board 3 conveyed and held at the board holding position P1 in the application and feed operating region, application and feed operation for solder paste or the like is performed by the applicator-feeder head, and thereafter the board 3 is conveyed and held at the board holding position P2 in the mounting operation region R2 by the board conveyance unit 12, where the mounting of a component onto the held board 3 via the applied and fed solder paste or the like can be carried out by the head device 20. That is, in the component mounting apparatus 101, application and feed operation with solder paste or the like and component mounting operation can be carried out, allowing efficient component mounting to be achieved and besides downsizing of the apparatus to be achieved.

In addition, in the applicator-feeder head, a fitting portion which has a configuration common to the fitting portion 40a of the IC component feeder head 10 and the fitting portion 140a of the chip component mounting head 110 and which can be removably fitted to the head fitting portion 4a of the XY robot 4 is formed in the main frame, and moreover a head control unit which performs operation control for the applicator-feeder head is supported and provided to the main frame. Further, individual interconnection lines for the power line(s) L1 and the communication line(s) L2 provided in the component mounting apparatus 101 are usable in common also for the applicator-feeder head. Via these interconnection lines, the head control unit of the applicator-feeder head and the control unit 45 on the apparatus main body side can be electrically and controllably connected to each other.

Next, with respect to the component mounting method for the component mounting apparatus 101 in which the head device 10 having the above-described construction is selectively loaded, here is explained a concrete operation, for example, that a component fed from the cassette component feeder 8 in the mounting operation region R1 is sucked and picked up by the head device 10 and then mounted onto the board 3 held at the board holding position P1.

First, referring to FIG. 1, the component image pickup camera 60 of the head device 10 is moved by the XY robot 4 so as to be positioned above the component feed position 6a where the component pickup in the cassette component feeder 8 is performed. In this operation, since the component image pickup camera 60 is fitted to the main frame 40 in the head device 10 at such a height position as to be prevented from interfering with the cassette component feeder 8, such interference never occurs. Thereafter, an image of the component positioned at the component feed position 6a is picked up by the component image pickup camera 60. The picked-up image data is inputted to the control unit 45 and subjected to image recognition process, so that a position where the component is actually positioned is recognized.

Based on a result of the recognition process, the head device 10 is moved in the X-axis direction or Y-axis direction by the XY robot 4, and the suction nozzle 11 that first performs the suction and pickup of the component is positioned to above the component. Thereafter, the ball screw shaft 51 is driven into forward or reverse rotation by the up/down drive motor 53 in the up/down unit 50 corresponding to the suction nozzle 11, by which down movement of the nut portion 52 is started. As a result, down movement of the head frame 33 coupled to the nut portion 52 via the coupling bar 54 is started, causing the entire head-body unit 30 to be moved down, by which the down movement of the suction nozzle 11 is started.

Then, when the lower end of the suction nozzle 11 comes into contact with the component, the drive of the up/down drive motor 53 is stopped, and the down move of the suction nozzle 11 is stopped. As this goes on, the component is sucked and held by the suction nozzle 11. After this suction and holding, the ball screw shaft 51 is driven into rotation in a direction opposite to that of the down move by the up/down drive motor 53, by which the suction nozzle 11 that has sucked and held the component is moved up so that the component is sucked and picked up from the component feed position 6a. In addition, also according to the other suction nozzles 11 included in the head device 10, the individual operations described above are performed iteratively, so that suction and pickup of the individual components by the individual suction nozzles 11, respectively, is performed one by one.

After that, the head device 10 is moved by the XY robot 4 toward above the board 3 held at the board holding position P1. In addition, for this movement process, the case may be that an image of the sucking-and-holding posture of the component sucked and held by each suction nozzle 11 is picked up and, based on a recognition result of the picked-up image, any positional shift amount of the component is corrected by rotational move of the suction nozzle 11 by the rotation drive motor 34.

When the head device 10 has reached above the board 3, alignment between the suction nozzle 11 that first performs the component mounting and the mounting position on the board 3 for the component is performed. After this alignment, the ball screw shaft 51 is driven into rotation in either forward or reverse direction by the up/down drive motor 53, by which a down of the suction nozzle 11 is started. While the component is pressed in contact against the component mounting position on the board 3, the down movement is stopped and, concurrently, the suction and holding of the component by the suction nozzle 11 is released. Thereafter, the suction nozzle 11 is moved up, by which the component is mounted onto the board 3. These individual operations are iteratively performed for the individual suction nozzles 11, thus the individual components being mounted onto the board 3.

The above description has been given about the operation of the head device 10 in the mounting operation region R1 of the component mounting apparatus 101. However, since the head device 20 is similar in construction to the head device 10, the operation of the head device 20 in the mounting operation region R2 is also similar thereto except that the feeding mode for the individual components differs.

Also, the width of the mounting operation region R1 in the shown X-axis direction as shown in FIG. 1 is so set that the individual suction nozzles 11 included in the head device 10 are each enabled to suck and hold a component from any one of the component feed positions 6a of the cassette component feeder 8. That is, a minimum required width of the mounting operation region R1 is so determined that a suction nozzle 11 positioned at the shown left end of the head device 10 can be positioned to above the component feed position 6a positioned at the shown right end and that a suction nozzle 11 positioned at the shown right end of the head device 10 can be positioned to above the component feed position 6a positioned at the shown left end. Moreover, the width of the mounting operation region R2 is also set according to the same concept as that of the mounting operation region R1.

According to the first embodiment, the following various types of effects can be obtained.

The component mounting apparatus 101, in which the head devices 10 and 20 can be removably loaded to the XY robots 4 and 14, respectively, is enabled to flexibly fulfill the mounting of various types of components. Particularly in the case where one head unit corresponding to the type of a component to be mounted (i.e., suitable for the mounting of a component to be mounted) is selected from among a plurality of types of head units, e.g. from among those including the IC component mounting head 10 and the chip component mounting head 110, and then loaded onto the XY robot 4, 14, the component mounting apparatus 101 is enabled to efficiently fulfill the mounting of diversified types of components.

Also, on the main frame 40 in each head unit (e.g., head device 10), the head control unit 90 for controlling the operation of the head device 10 is supported and provided so as to be integrated with the head device 10, so that changing the head device 10 allows the head control unit 90 as well to be changed concurrently. Accordingly, the changing work for the head controller 91 or the head driver circuit 92, which would need to be changed due to the changing of the head unit, can be simplified to a large extent, so that the changing and loading work for the head unit can be made easy to fulfill.

Meanwhile, by virtue of the arrangement that the control unit 45 provided to the apparatus main body side is equipped with control-related structures (e.g., the XY robot controller 48 and the main apparatus controller 47) that do not need to be changed even if the head unit to be loaded onto the XY robot 4, 14 is changed in type, it becomes possible to the structure of the head control unit 90, which is to be provided integrally in the head device 10 or the like, can be limitedly reduced to a necessary minimum, so that the structure of the head unit can be simplified and downsized with such a head control unit included therein.

Further, the power line(s) L1 and the communication line(s) L2, which are interconnection lines for electrically and controllably connecting the head control unit 90 in the head unit having such a structure (e.g., head device 10) and the control unit 45 on the apparatus main body side to each other are so made as to be usable in common regardless of the type of the head unit, i.e. the type of the head control unit. Therefore, even when the head unit is changed and loaded, changing and altering work for the interconnection lines is not involved. Thus, the changing work for the head unit can be made even easier to fulfill.

Also, by virtue of the arrangement that the head control unit 90 having the head controller 91, the head driver circuit 92 and the like is provided integrally with the head device 10, it becomes possible to confine the interconnection lines therebetween to the power line(s) L1 for feeding electric power necessary for the head device 10 to operate and the communication line(s) L2 for performing transmission of control information therebetween. As a result of this, the amount of interconnection lines between the head device 10 and the control unit 45 can be reduced remarkably, compared with the prior art. Accordingly, the issue that the moving operation of the head unit by the XY robot would be obstructed by a large amount of the interconnection lines, which would be involved in the prior art, can be improved, so that the operating characteristics for the moving operation of the head unit by the XY robot can be improved.

The common head fitting portion (e.g., head fitting portion 4a) that allows the individual head units to be removably fitted is formed in each of the XY robots (e.g., XY robot 4). Meanwhile, the fitting portion (e.g., fitting portion 40a) formed in a configuration common to the individual head units for engagement of the head fitting portion is included in each of the head units (e.g., IC component mounting head 10). Thus, performing engagement or disengagement between the two members allows the changing and loading of the head unit to be easily achieved.

Further, the individual control circuit boards (head controller 91, head driver circuit, I/O unit 94) in the head control unit 90 included in the head unit (e.g., head device 10) are so arrayed and placed that their individual surfaces are generally perpendicular to the surface of the board with specified gaps provided between the individual control circuit boards. As a result of this, calories generated from the individual control circuit boards by control operation can be removed easily and efficiently by natural ventilation at the individual gaps. Further, since such individual gaps are formed so as to extend along the vertical direction, which is a direction along the surfaces of the individual control circuit boards, the generated calories induce ascending air at the gaps, so that the cooling by the natural ventilation can be exerted more effectively.

Thus, it becomes practicable to improve the productivity for component mounting by realizing the above-described individual effects.

Now, some effects obtained by the mechanical structure of the head device 10 of the first embodiment are described below. This description will include an explanation of the mechanical structure of the prior art head unit and problems that would arise when the prior art head unit has that structure.

Conventionally, there have been known various structures for such a type of component mounting head (see, e.g., Japanese unexamined patent publication No. 2000-294991 A).

Figure 15:
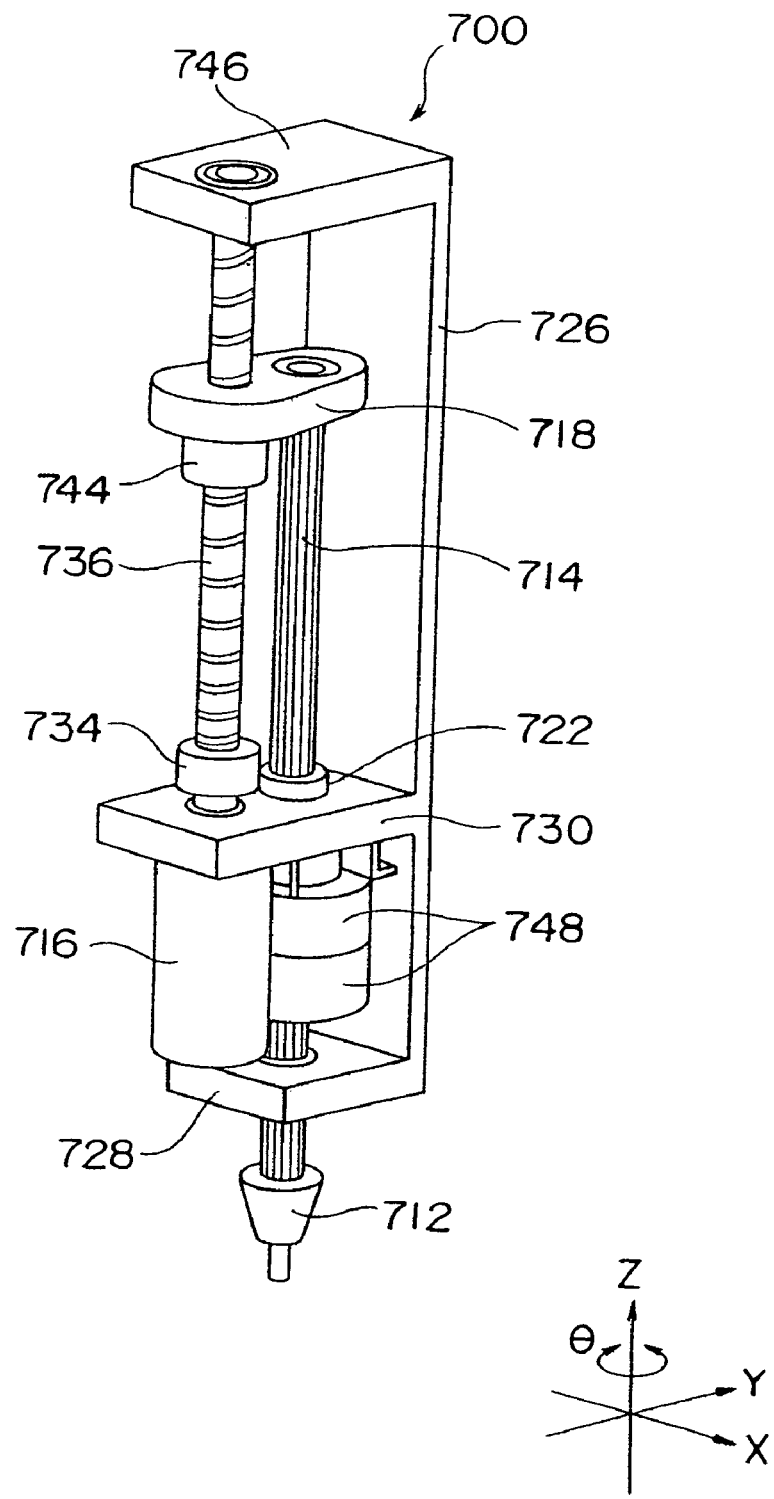
FIG. 15 is a perspective view of a prior-art head unit for use of explanation of an effect obtained by the mechanical structure of the head unit of the first embodiment.

For example, FIG. 15 shows a schematic perspective view of a head unit 700 as an example of such conventional component mounting heads.

As shown in FIG. 15, the head unit 700 is set along a vertical direction Z, having a spline shaft 714 on which a suction nozzle 712 is coaxially provided at its lower end. The spline shaft 714 is supported by a first rib 728 provided integrally with the lower end of a vertically positioned bracket 726, and by a second rib 730 integrally provided near a mid portion, in such a fashion that the spline shaft 714 is movable up and down along the axis length direction via a spline nut 722 and rotatable about a rotational center given by its axial center.

The second rib 730, which supports by its lower side face a Z-axis motor 716 provided near above the first rib 728 as viewed in the figure is integrated with the bracket 726. Also, the second rib 730 has a through hole for the spline shaft 714 and a through hole for the output shaft of the Z-axis motor 716.

The output shaft of the Z-axis motor 716 is connected to a lower end of a feed screw shaft 736 located along the vertical direction via a Z-axis coupling 734, and an upper end of the feed screw shaft 736 is rotatably supported by an upper-end rib 746 provided integrally with an upper end of the bracket 726. Further, the feed screw shaft 736 is screwed with a ball screw nut 744 fixed to a Z-axis power transmission 718 formed into a generally elliptical disc shape. Meanwhile, the upper end portion of the spline shaft 714 set parallel to the feed screw shaft 736 is rotatably supported by and vertically engaged with the Z-axis power transmission 718.

On the lower side of the second rib 730 is located a hollow θ-axis encoder 724 through which the spline shaft 714 extends internally. Its input shaft is joined with the lower side face of the spline nut 722 so as to detect a rotational angle of the spline shaft 714.

The head unit 700 is supported and fixed to an XY robot or the like, which is a head moving unit for moving the head unit 700 in a direction extending generally along the surface of the board onto which the component is to be mounted. The support and fixation of the head unit 700 to the XY robot is fulfilled by a back side of the bracket 726 shown in FIG. 15 (i.e., by its side opposite to the side on which the feed screw shaft 736 and the spline shaft 714 are placed). Also, in a case where a plurality of suction nozzles 712 are provided on the head unit 700, the individual suction nozzles 712 are arrayed, for example, in a line along the shown X-axis direction, while the spline shafts 714 and the feed screw shafts 736 are provided so as to correspond to the individual suction nozzles 712, respectively. Further, the individual spline shafts 714 and the individual feed screw shafts 736 are supported by the brackets 726 (each including the upper-end rib 746, the first rib 728 and the second rib 730), respectively.

Figure 16:
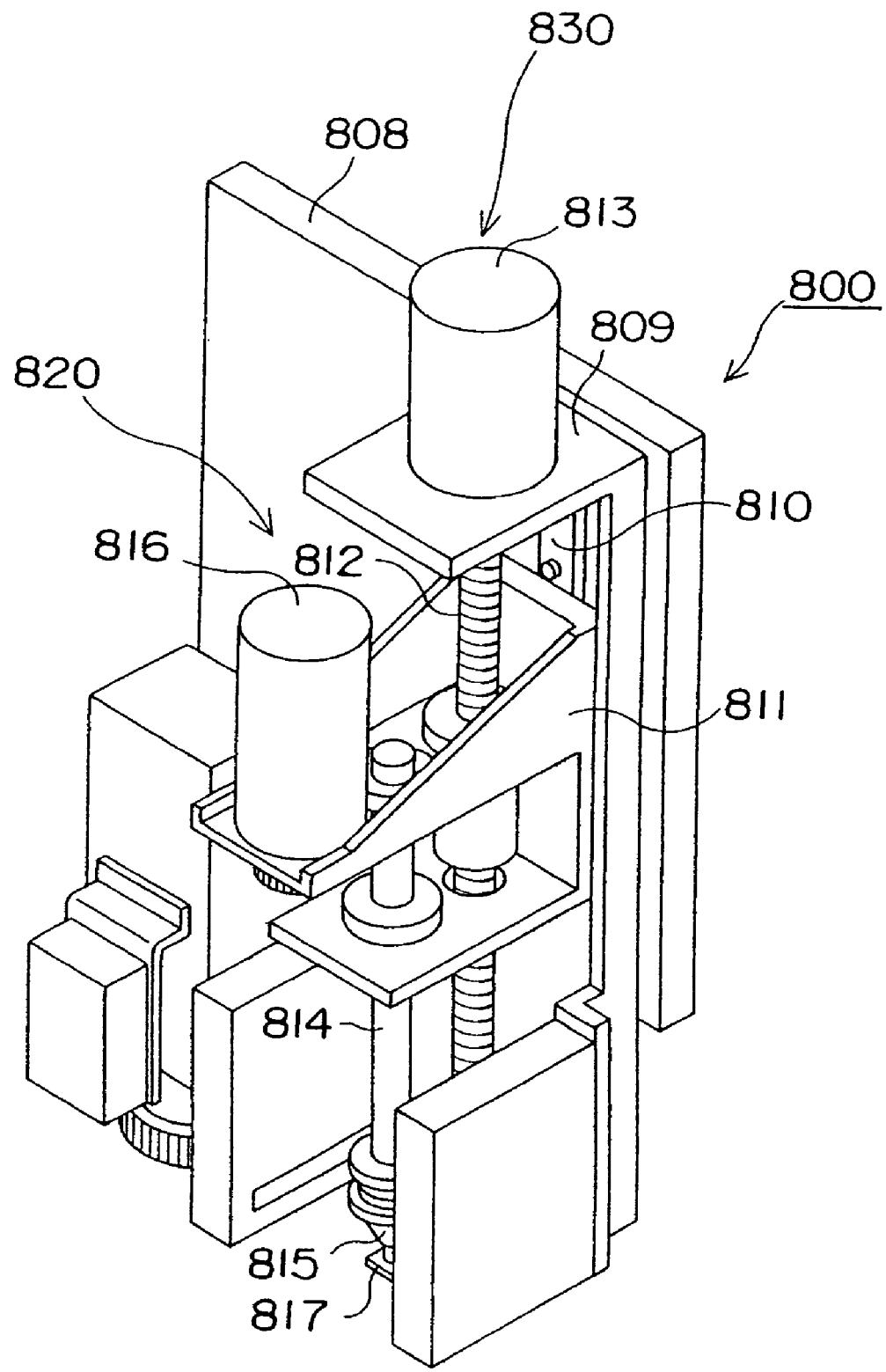
FIG. 16 is a perspective view of head unit according to another prior art example.

FIG. 16 is a schematic perspective view showing a schematic construction of a head unit 800 as a component mounting head according to another prior art example (e.g., Japanese unexamined patent publication No. 2000-294988 A).

As shown in FIG. 16, the head unit 800 includes a head unit 820, which has a suction nozzle 815 for sucking and holding a component 817, a shaft 814 having the suction nozzle 815 fitted at its lower end, and a motor 816 for driving rotational move of the suction nozzle 815 by rotationally moving about an axial center of the shaft 814, and an up/down unit 830 which has a ball screw 812a, a nut portion 812b screwed with the ball screw 812a and fixed to the head unit 820 and a motor 813 for driving rotational move of the ball screw 812a about the axial center. By up/down operation of the nut portion 812b performed by the up/down unit 830, up/down operation of the head unit 820 as a whole is performed, by which up/down operation of the suction nozzle 815 can be performed. It is noted that the nut portion 812*b* and the head unit 820 are coupled to each other via a bracket 811.

The bracket 811 is up/down movably supported on an up/down frame 809 of the up/down unit 830, and further the head unit 820 and the up/down unit 830 are supported via the up/down frame 809 by a mechanical interface member 808, which is a planar-shaped member. Also, the head unit 800 can be fitted via the mechanical interface member to a head moving unit (not shown) which performs horizontal movement of the head unit 800. As to the placement relation among the mechanical interface member 808, the up/down unit 830 and the head unit 820, the up/down unit 830 is placed between the mechanical interface 808 and the head unit 820.

In the head unit 700 of the prior art structure, unfortunately, the Z-axis motor 716, the feed screw shaft 736 and the ball screw nut 744, which constitute a drive unit for driving up/down operation of the spline shaft 714, i.e. up/down operation of the suction nozzle 712, are positioned most distant in the horizontal direction from the back side of the bracket 726, which is the support-and-fixation position of the head unit 700 to the XY robot. The drive unit as shown above is a device that generates thrust and is positioned most distant from the support-and-fixation position, involving a problem that the moment generated due to the occurrence of the thrust becomes large and, under the effect of the moment, operating characteristics in the moving operation of the head unit 700 by the XY robot deteriorates. In such a case, it may result that high-precision movement of the head unit 700 by the XY robot is impossible to do, high-precision component mounting is impossible to do, and a deterioration of productivity in the component mounting is incurred.

Furthermore, in the head unit 700, as shown in FIG. 15, the spline shaft 714 with the suction nozzle 712 provided thereon is placed between the shown front face of the bracket 726 and the drive unit for the feed screw shaft 736 and the like. With such placement, workability for the suction nozzle 712, the θ-axis motor encoder 748, the spline shaft 714 and the spline nut 722, which involve more frequent maintenance than the drive unit, may be largely inhibited depending on the configuration and size of the bracket 726 and the drive unit. In such a case, there is a problem that the maintainability for the head unit 700 is deteriorated, making it impossible to constantly keep component mounting of stable precision, resulting in deterioration of the productivity.

Further, the head unit 700 as shown above, in many cases, include a component recognition camera (not shown) for picking up an image of a component at a feed position and recognizing the position to ensure the suction and holding of the fed component by the suction nozzle 712. Additionally providing such a component recognition camera in the head unit 700, although contributing to the fulfillment of high-precision component mounting, yet leads to a limitation of the access route from the external of the head unit 700 to the suction nozzle 712 or the like from the viewpoint of the maintainability of the head unit 700, which may result in a factor of further deterioration of the maintainability of the suction nozzle 712 and the like. In addition to this, the actual move range of the head unit 700 by the XY robot is expanded to ensure the move range of the suction nozzle 712 in the direction extending generally along the surface of the board for component mounting. In a case where the move range of the head unit 700 is expanded, there would result an upsizing of the component mounting apparatus. Meanwhile, in another case where the move range of the suction nozzle 712 in the direction extending generally along the surface of the board for component mounting is narrowed with a view to avoiding any upsizing of the apparatus, there would result a deterioration of the efficiency of component mounting. In either case, there is a problem that the productivity for component mounting is degraded.

In the head unit 800, on the other hand, the up/down unit 830, which is a device for generating thrust, is arranged close to the mechanical interface member 808. As a result, although the arrangement indeed does not cause any deterioration of operating characteristics for movement of the head unit 800, yet the adoption of such arrangement would cause the distance from the mechanical interface member 808 to the head unit 820 to increase. As the distance to the head unit 820 is increased, vibrations due to the move of the head unit 800 would be transferred to the suction nozzle 815 as large vibrations. Thus, there is a problem that the component mounting precision may be deteriorated, causing the productivity to degrade.

Further, with the arrangement that involves a large distance from the mechanical interface member 808 to the head unit 820, there arises a need that the bracket 811, which supports the head unit 820, be also formed as a large rigid member, inhibiting downsizing and weight reduction of the head unit 800. Also with such arrangement, the center of the mechanical interface member 808, which is a member for supporting the head unit 800 to the head moving unit, and the center-of-gravity position of the head unit 800 come to largely differ from each other, and such a difference would lower the operating characteristics in the moving operation of the head unit 800.

Furthermore, from the viewpoint of maintainability, by virtue of the arrangement that the up/down unit 830 is positioned between the head unit 820 and the mechanical interface member 808, indeed the maintainability of the suction nozzle 815 in the head unit 820 can be made successful, but the exposed arrangement of the ball screw shaft 812 causes dust to tend to adhere to oil feeding sites on the screw surface. As a result, there is another problem that the whole maintainability is not necessarily improvable.

Accordingly, the head device 10 of the foregoing first embodiment is so structured as to make it possible to provide a component mounting head as well as a component mounting apparatus which are capable of solving the above-described problems, performing efficient, high-precision moving operations, and making the productivity for component mounting improvable.

More specifically, referring to the positional relation among the individual support centers in the Y-axis direction in the head device 10, the individual support centers are so positioned that the distance L1 between the support center J of the main frame 40 by the XY robot 4 and the support center T of each up/down unit 50 becomes smaller than the distance L2 between the support center J of the main frame 40 and the support center S of each head-body unit 30. As a result of this, in the head device 10, each up/down unit 50, which has a characteristic that occurrence of a large thrust is involved in its driving, can be positioned closer to the support center J of the main frame 40, so that the magnitude of the moment generated due to the occurrence of the thrust can be reduced. Thus, operation control for the moving operation of the head device 10 by the XY robot 4 can be improved, so that efficient, high-precision moving operation of the head device 10 can be fulfilled and the productivity for component mounting can be improved.

Furthermore, with a view to fulfilling the positional relation among the individual support centers as described above, the up/down unit 50 formed of the ball screw shaft 51 or the like is positioned inside the main frame 40, and the head-body unit 30 having the suction nozzle 11 is positioned on the exterior side face of the main frame 40. As a result of this, workability for the head-body unit 30 that needs comparatively high frequencies of maintenance such as changing and adjustment of the suction nozzle 11 and adjustment of the shaft 31 can be made successful, thus allowing the maintainability of the head device 10 to be enhanced. More specifically, it becomes possible to improve the maintainability for ultrasonic cleaning work that involves removal of the suction nozzles 11 from the head-body unit 30 because of sticking of taping minute scraps in the component suction by the suction nozzle 11 or deposition of solder in the component mounting or other reasons, as well as for periodic replacement work for filters contained in the suction nozzles 11 and the like. Thus, component mounting of improved productivity becomes achievable.

On the other hand, the up/down unit 50 positioned within the main frame 40 based on the positioning of the head-body unit 30 on the exterior side face of the main frame 40 is generally subjected only to such maintenance as injection of grease to bearing portions or the like. Therefore, only ensuring the access route for the grease injection work can prevent deterioration of the maintainability. Further, by the positioning of each up/down unit 50 inside the main frame 40, adhesion of dust or the like onto grease injection portions can be inhibited, producing an effect that the maintainability for the whole head device 10 is improved.

Also, with respect to the side face member that is part of the main frame 40, the individual head-body units 30 are positioned and supported outside thereof and the individual up/down units 50 are positioned and supported inside thereof, by which the distance from the side face member of the main frame 40 to the support center T of each up/down unit 50, and the distance therefrom to the support center S of each head-body unit 30 can be made to be a necessary minimum. Thus, the member for supporting the individual up/down units 50 and the head-body units 30 can be reduced in size, allowing the head device 10 to be reduced in size and weight, and moreover vibrations generated from move of the head device 10 to the head-body unit 30 or the like can be reduced in amount.

Furthermore, the up/down unit 50, which involves less maintenance frequencies as compared with the head-body unit 30, is positioned in an emptied space inside the main frame 40, which is formed into a generally box-like shape to realize its high rigidity and light weight at the same time. Thus, the emptied space can be utilized effectively, allowing the head device 10 to be reduced in size and weight.

Second Embodiment

The present invention is not limited to the above-described embodiment, and may be embodied in other various modes. For example, a head unit 210 included in a component mounting apparatus according to a second embodiment of the present invention is generally similar in function and structure to the head device 10 of the first embodiment, but differs in positioning of individual control circuit boards included in the head unit. Only those different portions in structure are described below.

Figure 12:
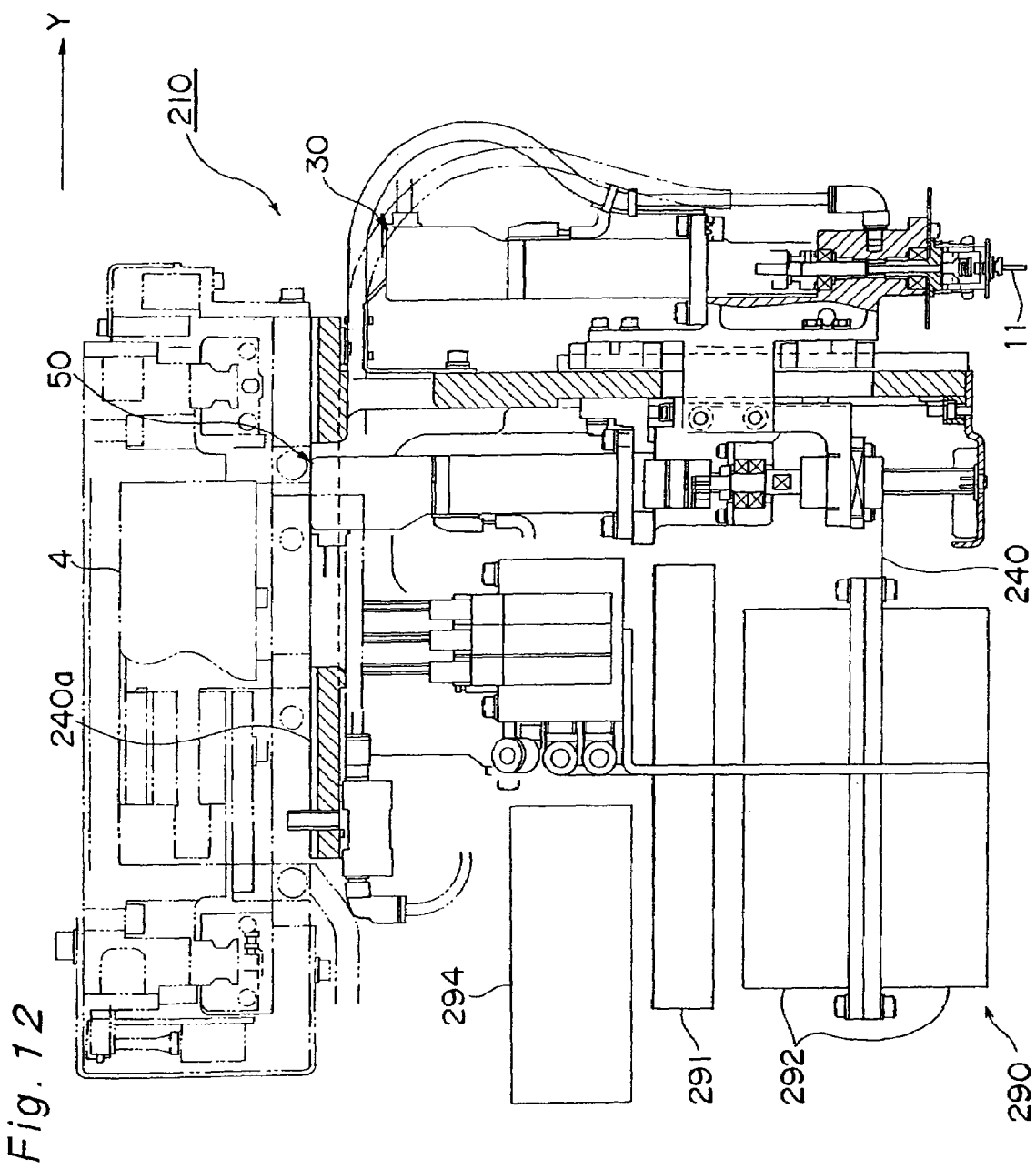
FIG. 12 is a sectional view of a head unit (a head unit whose control circuit board is horizontally positioned) which is included in a component mounting apparatus according to a second embodiment of the present invention.
Figure 13:
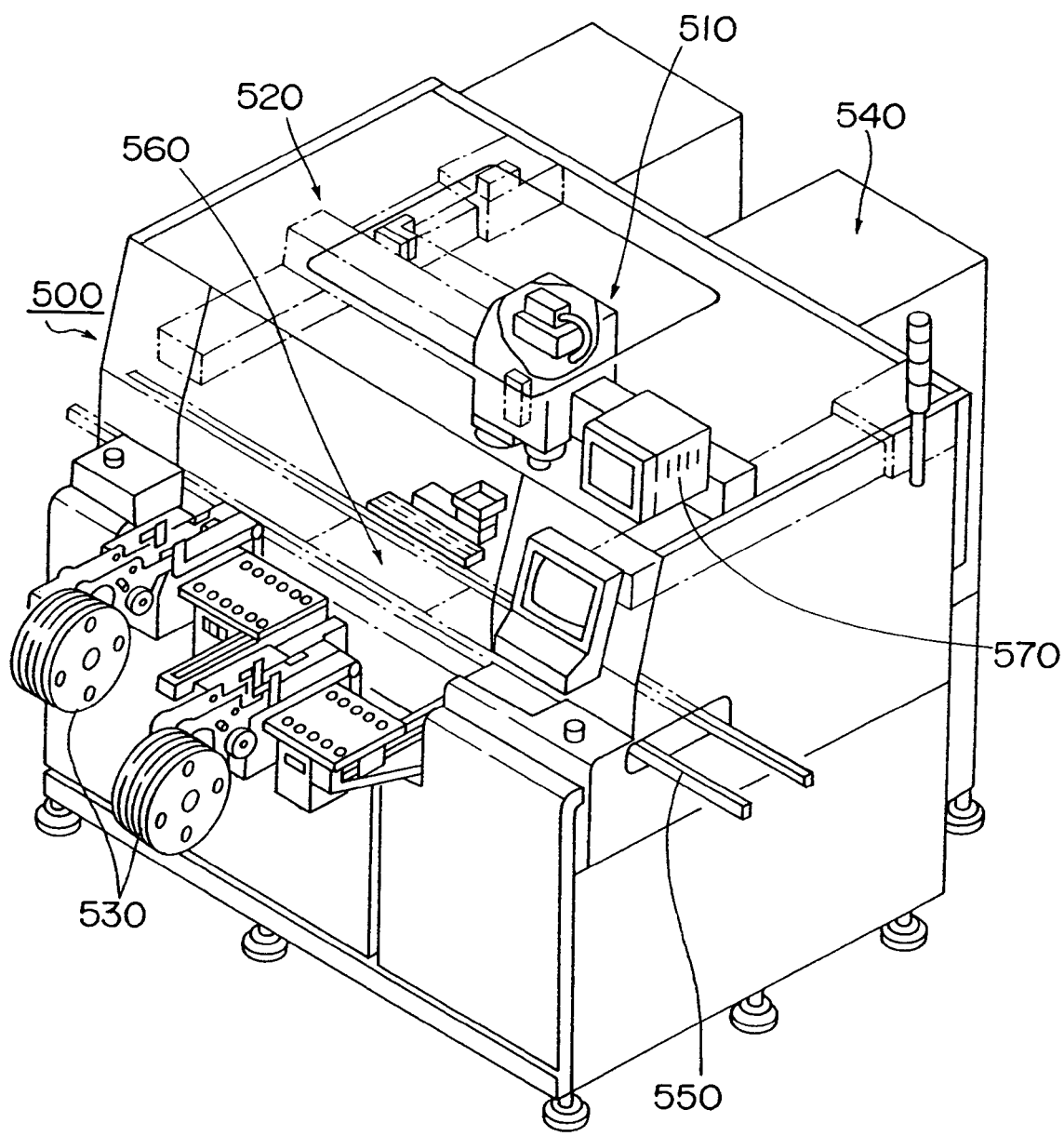
FIG. 13 is a perspective view showing a structure of a prior-art component mounting apparatus.
Figure 14:
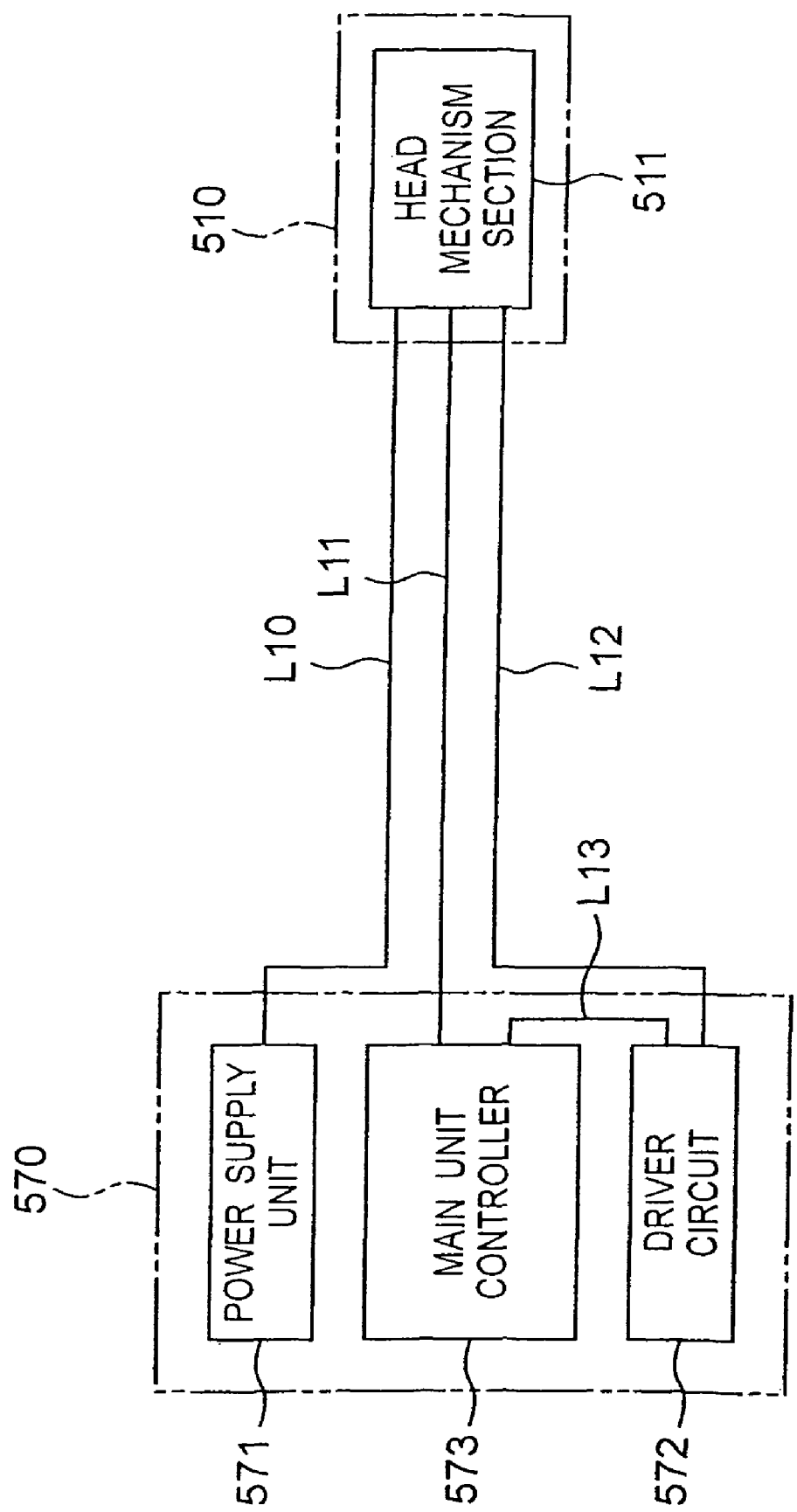
FIG. 14 is a control block diagram showing a control-related structure of the prior-art component mounting apparatus.

A sectional view of the head unit 210 like this is shown in FIG. 12. As shown in FIG. 12, the head unit 210, like the head device 10 of the first embodiment, includes three head-body units 30 having suction nozzles 11, and three up/down units 50 for performing moving-up and -down operation of their corresponding head-body units 30. Also, the individual head-body units 30 and the individual up/down units 50 are supported and provided on a main frame 240. Further, on the main frame 240, a fitting portion 240a engageable with a head fitting portion in the XY robot is formed, and its engagement and disengagement allows the head unit 210 to be loaded and unloaded onto the XY robot.

Furthermore, a head control unit 290 for performing operation control for the head unit 210 is also supported and provided to the main frame 240. In the head control unit 290, a plurality of control circuit boards are arrayed with their surfaces generally parallel to the surface of a board 3, i.e. provided so as to be arrayed along the vertical direction. More specifically, as shown in FIG. 12, control circuit boards such as a plurality of head driver circuits 92, a head controller 291 and an I/O unit 294 are arrayed in a line in this order from lower toward upper side in the figure. Also, gaps for use of ventilation for ventilating calories generated during control operations in the individual control circuit boards are provided between the individual control circuit boards so that the generated calories can effectively be removed by natural ventilation of air between the gaps.

In the head unit 210 having such construction, by virtue of the arrangement that the individual control circuit boards in the head control unit 290 are supported to the main frame 240 so that their surfaces become generally parallel to the surface of the board 3, even when the head unit 210 is moved by the XY robot 4 in the X-axis direction or Y-axis direction, vibrations occurring to the individual control circuit boards in the head control unit 290 can be suppressed. In particular, the head control unit is provided to the head unit itself that moves in the X-axis direction or Y-axis direction with the view to easiness of the changing and loading of the head unit to the XY robot. However, since the occurrence of vibrations in the individual control circuit boards is suppressed, any detrimental effects due to the move of the head unit on the head control unit is prevented beforehand.

The foregoing respective embodiments have been described on a case where the individual control circuit boards are arrayed so as to be generally perpendicular to the surface of the board 3, and another where the control circuit boards are arrayed generally parallel. However, instead of such cases of generally perpendicular and generally parallel array, the control circuit boards may also be arrayed in parallel to one another, for example, along a slanted direction. In such a case, voids are present between the individual control circuit boards, and the heat removal effect can be obtained.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2003-354896 filed on Oct. 15, 2003 including specification, drawing and claims, and the disclosure of Japanese Patent Application No. 2003-356060 filed on Oct. 16, 2003 including specification, drawing and claims are incorporated herein by reference in its entirety.

The invention claimed is:

1. A component mounting apparatus for mounting fed components onto a board, the component mounting apparatus comprising:

one head unit which has a component holding member for holding one of the components and which is selected from among a plurality of types of head units according to types of the fed components;

a head moving unit which has a head fitting portion onto which the selected one head unit is removably loaded, for moving the head unit loaded on the head fitting portion in a direction extending generally along a surface of the board; and a head control unit which is provided for each of the head units, for controlling component mounting operation by a head unit corresponding to the loaded head unit, wherein the head control unit includes a plurality of control circuit boards having control circuits for performing control for the component mounting operation by the head unit, and the control circuit boards are disposed so that the surfaces of the control circuit boards become generally parallel to the surface of the board.

* * * * *